(12) United States Patent
Song et al.

(10) Patent No.: US 11,825,708 B2
(45) Date of Patent: Nov. 21, 2023

(54) DISPLAY PANEL AND DISPLAY DEVICE INCLUDING FIRST AND SECOND WIRINGS

(71) Applicant: SAMSUNG DISPLAY CO., LTD., Yongin-si (KR)

(72) Inventors: Dokeun Song, Yongin-si (KR); Hyunah Sung, Yongin-si (KR); Sukyoung Yang, Yongin-si (KR); Dongmin Lee, Yongin-si (KR); Hyuneok Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 218 days.

(21) Appl. No.: 17/183,641

(22) Filed: Feb. 24, 2021

(65) Prior Publication Data

US 2022/0059636 A1 Feb. 24, 2022

(30) Foreign Application Priority Data

Aug. 24, 2020 (KR) .................. 10-2020-0106357

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
CPC ............. H01L 27/3276; H01L 27/3262; H01L 27/124; H10K 59/131; H10K 59/1213; H10K 59/126; H10K 59/1315; H10K 59/121; H10K 59/65; H10K 59/122;
(Continued)

(56) References Cited

U.S. PATENT DOCUMENTS

| 8,174,471 B2 | 5/2012 | Kim et al. |
| 10,818,746 B2 | 10/2020 | Kim et al. |
| 2017/0162111 A1* | 6/2017 | Kang ................... G09G 3/3225 |

(Continued)

FOREIGN PATENT DOCUMENTS

| CN | 108807488 A | * 11/2018 |
| CN | 210223352 U | * 3/2020 |

(Continued)

*Primary Examiner* — Nduka E Ojeh
*Assistant Examiner* — Laura M Dykes
(74) *Attorney, Agent, or Firm* — F. Chau & Associates, LLC

(57) ABSTRACT

A display panel includes a substrate including a component area, a display area at least partially surrounding the component area, and a first non-display area at least partially surrounding the display area. A first wiring is in the display area and extends in a first direction to face the component area. A second wiring is in the display area and extends in the first direction to face the component area. The second wiring is spaced apart from the first wiring with the component area therebetween. A pixel circuit is connected to one of the first and second wirings and includes at least one thin-film transistor. A display element is connected to the pixel circuit. A cross-sectional area of the first wiring crossing in a second direction that is perpendicular to the first direction is different from a cross-sectional area of the second wiring crossing in the second direction.

18 Claims, 18 Drawing Sheets

(58) Field of Classification Search
CPC ...... H10K 50/84; H10K 59/123; H10K 59/40;
H10K 71/60; G09G 3/3208
USPC .......................................................... 257/40
See application file for complete search history.

(56) References Cited

U.S. PATENT DOCUMENTS

| | | | |
|---|---|---|---|
| 2019/0051718 A1* | 2/2019 | Zhang | G09G 3/3225 |
| 2019/0214596 A1* | 7/2019 | Park | G06F 3/0446 |
| 2020/0144352 A1 | 5/2020 | Lee et al. | |
| 2020/0273919 A1* | 8/2020 | Ding | H10K 50/841 |

FOREIGN PATENT DOCUMENTS

| | | |
|---|---|---|
| KR | 10-0906103 | 7/2009 |
| KR | 10-2012-0000210 | 1/2012 |
| KR | 10-2017-0114040 | 10/2017 |
| KR | 10-2020-0036681 | 4/2020 |
| KR | 10-2020-0051108 | 5/2020 |

\* cited by examiner

DISPLAY PANEL AND DISPLAY DEVICE INCLUDING FIRST AND SECOND WIRINGS

CROSS-REFERENCE TO RELATED APPLICATION

This application claims priority under 35 U.S.C. § 119 to Korean Patent Application No. 10-2020-0106357, filed on Aug. 24, 2020 in the Korean Intellectual Property Office, the disclosure of which is incorporated by reference in its entirety herein.

TECHNICAL FIELD

One or more embodiments relate to a display panel and a display device, and more particularly, to a display panel, in which a display area at least partially surrounds an area including a component which is an electronic element, and a display device.

DISCUSSION OF RELATED ART

The usage of display devices has become increasingly diverse. For example, display devices have become thinner and lighter which has led to an expansion of the uses of display devices.

As the display devices are used in various ways, there are various methods of designing the shapes of the display devices. In addition, various functions for connecting or linking to a display device have been increased while enlarging the area occupied by the display area of the display device. A display device having a component area which is at least partially surrounded by a display area and performs various functions has been studied as a method to add various functions while enlarging the display area.

SUMMARY

One or more embodiments include a display panel including a component area which is at least partially surrounded by a display area and includes a component as an electronic element, and a display device. One or more embodiments include a display panel, in which luminance deviation of a display element around a component area and emitting light is reduced, and a display device.

Additional aspects will be set forth in part in the description which follows and, in part, will be apparent from the description, or may be learned by practice of the presented embodiments of the disclosure.

According to an embodiment, a display panel includes a substrate including a component area, a display area at least partially surrounding the component area, and a first non-display area at least partially surrounding the display area. A first wiring is in the display area and extends in a first direction to face the component area. A second wiring is in the display area and extends in the first direction to face the component area. The second wiring is spaced apart from the first wiring with the component area therebetween. A pixel circuit is connected to one of the first and second wirings and includes at least one thin-film transistor. A display element is connected to the pixel circuit. A cross-sectional area of the first wiring crossing in a second direction that is perpendicular to the first direction is different from a cross-sectional area of the second wiring crossing in the second direction.

According to an embodiment, a first length of the first wiring in the first direction may be different from a second length of the second wiring in the first direction.

According to an embodiment, the first length may be greater than the second length, and the cross-sectional area of the first wiring may be greater than the cross-sectional area of the second wiring.

According to an embodiment, the at least one thin-film transistor may include a semiconductor layer on the substrate and a gate electrode on the semiconductor layer, and the first wiring and the second wiring may be on the same layer as the gate electrode.

According to an embodiment, the display panel may further include a first scan driver and a second scan driver in the first non-display area and apart from each other with the display area therebetween, wherein the first wiring may be connected to the first scan driver, and the second wiring may be connected to the second scan driver.

According to an embodiment, a first cross-sectional area of the first wiring overlapping a first surface crossing the first wiring in the second direction may be different from a second cross-sectional area of the first wiring overlapping a second surface parallel to the first surface.

According to an embodiment, the first wiring may include a first adjacent wiring and a second adjacent wiring, which are adjacent to each other, and a cross-sectional area of the first adjacent wiring overlapping the first surface may be different from a cross-sectional area of the second adjacent wiring overlapping the first surface.

According to an embodiment, a first width of the first wiring in the second direction may be different from a second width of the second wiring in the second direction.

According to an embodiment, a first thickness of the first wiring in a third direction perpendicular to the first direction and the second direction may be different from a second thickness of the second wiring in the third direction.

According to an embodiment, the display area may entirely surround the component area, the component area may include a transmission area and a second non-display area between the transmission area and the display area, and the display element is in the display area.

According to an embodiment, the component area may include a plurality of transmission areas, the display element may include a main display element and an auxiliary display element, the main display element may be in the display area, and the auxiliary display element may be between the plurality of transmission areas, which are adjacent to each other in the component area.

According to another embodiment, a display device includes a substrate including a component area, a display area surrounding the component area, and a first non-display area at least partially surrounding the display area. A first wiring is in the display area and extends in a first direction to face the component area. A second wiring is in the display area and extends in the first direction to face the component area. The second wiring is spaced apart from the first wiring with the component area therebetween. A pixel circuit is connected to one of the first wiring and the second wiring and includes at least one thin-film transistor. A display element is connected to the pixel circuit. A component overlaps the component area. A cross-sectional area of the first wiring crossing in a second direction that is perpendicular to the first direction is different from a cross-sectional area of the second wiring crossing in the second direction.

According to an embodiment, a first length of the first wiring in the first direction may be greater than a second length of the second wiring in the first direction, and the cross-sectional area of the first wiring may be greater than the cross-sectional area of the second wiring.

According to an embodiment, the at least one thin-film transistor may include a semiconductor layer on the substrate and a gate electrode on the semiconductor layer, and the first wiring and the second wiring may be on the same layer as the gate electrode.

According to an embodiment, a first cross-sectional area of the first wiring overlapping a first surface crossing the first wiring in the second direction may be different from a second cross-sectional area of the first wiring overlapping a second surface parallel to the first surface.

According to an embodiment, a first width of the first wiring in the second direction may be different from a second width of the second wiring in the second direction.

According to an embodiment, a first thickness of the first wiring in a third direction perpendicular to the first direction and the second direction may be different from a second thickness of the second wiring in the third direction.

According to an embodiment, the display area may entirely surround the component area, the component area may include a transmission area and a second non-display area between the transmission area and the display area, and the display element may be in the display area.

According to an embodiment, the component area may include a plurality of transmission areas, the display element may include a main display element and an auxiliary display element, the main display element may be in the display area, and the auxiliary display element may be between the plurality of transmission areas, which are adjacent to each other in the component area.

According to an embodiment, a display panel includes a substrate including a component area, a display area at least partially surrounding the component area, and a first non-display area at least partially surrounding the display area. A first wiring is in the display area and extends in a first direction to face the component area. A second wiring is in the display area and extends in the first direction. The second wiring is spaced apart from the first wiring with the component area therebetween. A pixel circuit is connected to one of the first wiring and the second wiring and includes at least one thin-film transistor. A display element is connected to the pixel circuit. At least one of: the first wiring has a width in a second direction that is perpendicular to the first direction that is different from a width of the second wiring in the second direction; and a thickness of the first wiring in a third direction that is perpendicular to the first direction and the second direction is different from a thickness of the second wiring in the third direction.

BRIEF DESCRIPTION OF THE DRAWINGS

The above and other aspects, features, and advantages of certain embodiments of the present inventive concepts will be more apparent from the following description taken in conjunction with the accompanying drawings, in which.

DETAILED DESCRIPTION OF EMBODIMENTS

Figure 1:
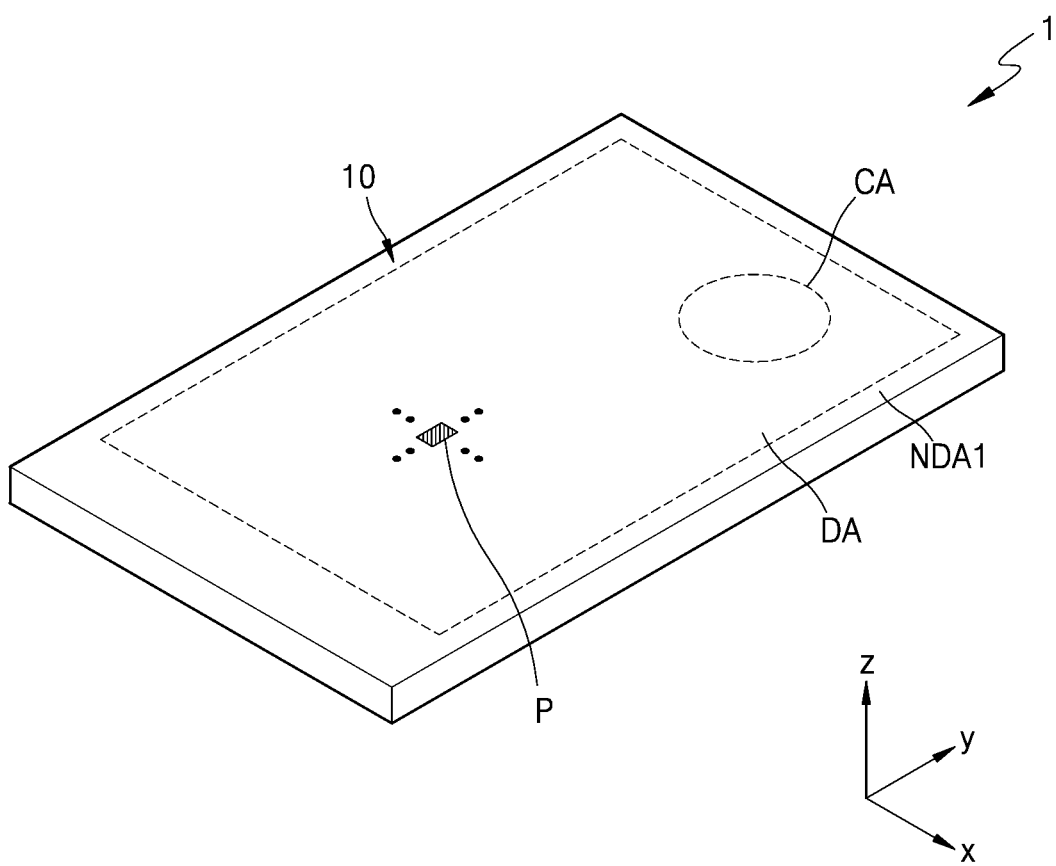
FIG. 1 is a perspective view of a display device according to an embodiment of the present inventive concepts.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present inventive concepts. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

The present inventive concepts will now be described more fully with reference to the accompanying drawings, in which embodiments of the present inventive concepts are shown. Like reference numerals in the drawings denote like elements, and thus their description will be omitted.

While such terms as "first," "second," etc., may be used to describe various elements, such elements must not be limited to the above terms.

The singular forms "a," "an," and "the" as used herein are intended to include the plural forms as well unless the context clearly indicates otherwise.

In the following embodiments, it is to be understood that the terms such as "including," "having," and "comprising"

are intended to indicate the existence of the features, or elements disclosed in the present disclosure, and are not intended to preclude the possibility that one or more other features or elements may exist or may be added.

It will be further understood that, when a layer, region, or component is referred to as being "on" another layer, region, or component, it can be directly or indirectly on the other layer, region, or component. That is, for example, intervening layers, regions, or components may be present. However, when a layer, region, or component is referred to as being "directly on" another layer, region, or component, no intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected and an intervening portion may be present.

The display device is a device for displaying an image. In an embodiment, the display device may be a mobile device that is portable, such as a game machine, a multimedia device, and a miniature personal computer (PC). Examples of the display device are a liquid crystal display, an electrophoretic display, an organic light-emitting display, an inorganic light-emitting display, a field emission display, a surface-conduction electron-emitter display, a quantum dot display, a plasma display, a cathode ray display, and the like. Hereinafter, as a display device according to an embodiment, an organic light-emitting display device will be described as an example. However, embodiments of the present inventive concepts may be various other types of display devices as described above.

FIG. 1 is a schematic perspective view of a display device 1 according to an embodiment of the present inventive concepts.

Referring to FIG. 1, the display device 1 may include a display panel 10. The display panel 10 may include a display area DA, a component area CA, and a first non-display area NDA1.

A pixel P may be disposed in the display area DA. In an embodiment, a plurality of pixels P may be arranged in the display area DA. However, for convenience of illustration, FIG. 1 shows only one pixel P in the display area DA. The pixel P may include a display element. The display panel 10 may provide an image by using light output from the pixel P. The pixel P may include a light-emitting diode as a display element that emits light of a certain color. In an embodiment, the light-emitting diode may include an organic light-emitting diode including an organic material as an emission layer. Alternatively, the light-emitting diode may include an inorganic light-emitting diode. Alternatively, the light-emitting diode may include quantum dots as an emission layer.

Hereinafter, for convenience of explanation, an embodiment in which the light-emitting diode includes an organic light-emitting diode will be mainly described in detail for convenience of explanation.

The component area CA may be an area in which a component that provides various functions to the display device 1 is disposed. For example, when the component includes a sensor or a camera using light, the component may include a transmission area through which light of the sensor or light traveling to the camera may pass.

The component area CA may be at least partially surrounded by the display area DA. For example, as shown in the embodiment of FIG. 1, the component area CA may be entirely surrounded by the display area DA. Hereinafter, an embodiment in which the component area CA is entirely surrounded by the display area DA will be mainly described in detail for convenience of explanation. However, embodiments of the present inventive concepts are not limited thereto.

In an embodiment, the component area CA may be disposed to be offset to the left or right side of the display device 1 in a first direction, such as a direction extending parallel to the x axis (e.g., an "x direction" or a "−x direction"). In addition, the component area CA may be arranged in various different positions, such as at an upper side, a center, or a lower side of the display device 1 in a second direction, such as a direction extending parallel to the y axis (e.g., a "y direction" or a "−y direction").

In an embodiment, the component area CA may have a circular shape or an elliptical shape in a plan view (e.g., in a plane defined in the first and second directions). In another embodiment, the component area CA may have a polygonal shape such as a rectangular shape or the like in a plan view. In another embodiment, the component area CA may include a curved portion. Hereinafter, an embodiment in which the component area CA has a circular shape in a plan view will be mainly described in detail. However, embodiments of the present inventive concepts are not limited thereto.

Although FIG. 1 illustrates that the display device 1 includes one component area CA, in another embodiment, the display device 1 may include a plurality of component areas CA.

The first non-display area NDA1 is an area that does not provide an image, and pixels may not be arranged in the first non-display area NDA1. The first non-display area NDA1 may at least partially surround the display area DA. In an embodiment, the first non-display area NDA1 may entirely surround the display area DA (e.g., in the first and second directions). A driver providing an electrical signal or power to the pixel P, or the like may be arranged in the first non-display area NDA1.

Figure 2:
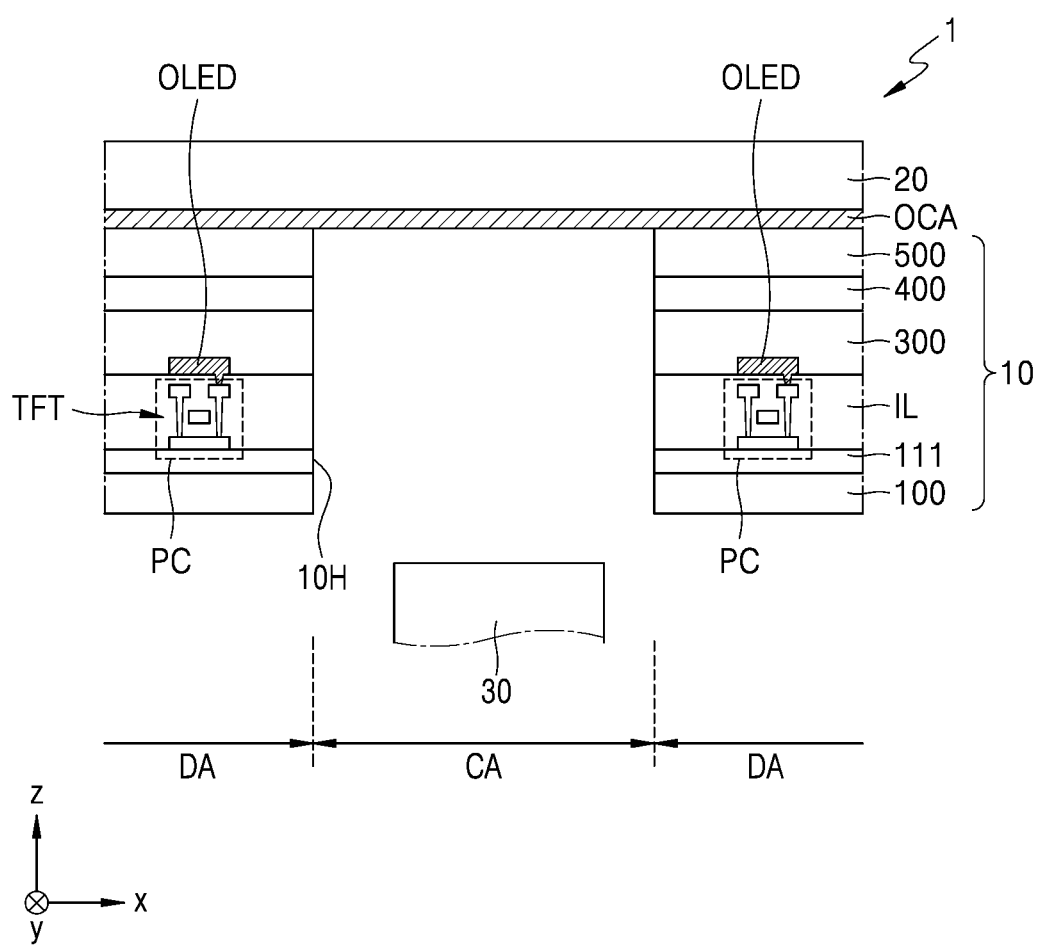
FIG. 2 is a cross-sectional view of a display device according to an embodiment of the present inventive concepts.

FIG. 2 is a schematic cross-sectional view of the display device 1 according to an embodiment of the present inventive concepts.

Referring to the embodiment of FIG. 2, the display device 1 may include the display panel 10, a window 20, and a component 30. The display panel 10 may include a substrate 100 and a multi-layered film on the substrate 100. The display area DA, a first non-display area, and the component area CA may be defined on the substrate 100 and/or the multi-layered film. For example, the substrate 100 may include the display area DA, a first non-display area, and the component area CA. Hereinafter, a case where the display area DA, the first non-display area, and the component area CA are defined on the substrate 100 will be mainly described in detail.

The display panel 10 may include the substrate 100, a buffer layer 111, an insulating layer IL, a pixel circuit PC, an organic light-emitting diode OLED, an encapsulation layer 300, a touch sensor layer 400, and an optical functional layer 500. In an embodiment, the substrate 100 may include a glass or a polymer resin such as at least one compound selected from polyethersulfone, polyarylate, polyetherimide, polyethylene naphthalate, polyethylene terephthalate, polyphenylene sulfide, polyimide, polycarbonate, cellulose triacetate, cellulose acetate propionate, and the like. In an embodiment, the substrate 100 may have a multi-layered structure including a base layer, which includes the above-stated polymer resin, and a barrier layer. The substrate 100 including the polymer resin may be flexible, rollable, or bendable.

The buffer layer 111 and the insulating layer IL may be disposed on the substrate 100. In addition, the pixel circuit PC and the organic light-emitting diode OLED, which is a display element connected to the pixel circuit PC, may be disposed above the substrate 100. The pixel circuit PC and the organic light-emitting diode OLED connected thereto may implement a pixel. In an embodiment, the pixel circuit PC may include at least one thin-film transistor TFT. The at least one thin-film transistor TFT may be connected to the organic light-emitting diode OLED.

The encapsulation layer 300 may cover the organic light-emitting diode OLED. In an embodiment, the encapsulation layer 300 may include at least one inorganic encapsulation layer and at least one organic encapsulation layer. In an embodiment, the at least one inorganic encapsulation layer may include at least one compound selected from aluminum oxide ($Al_2O_3$), titanium oxide ($TiO_2$), tantalum oxide ($Ta_2O_5$), zinc oxide (ZnO), silicon oxide ($SiO_2$) silicon nitride (SiNx), and silicon oxynitride (SiON). In an embodiment, the at least one organic encapsulation layer may include a polymer-based material. For example, the polymer-based material may include at least one material selected from a acrylic resin, an epoxy resin, a polyimide, and a polyethylene. In an embodiment, the at least one organic encapsulation layer may include acrylate.

In another embodiment, the encapsulation layer 300 may have a structure in which the substrate 100 and an upper substrate, which includes a transparent material, are combined with a sealing member to seal an internal space between the substrate 100 and the upper substrate. In an embodiment, a moisture absorbent, filler, or the like may be located in the internal space. The sealing member may be a sealant, and in another embodiment, the sealing member may include a material that is cured by a laser. For example, the sealing member may be frit. The sealing member may include a urethane resin, an epoxy resin, an acrylic resin, which are an organic sealant, or silicone or the like, which is an inorganic sealant. Examples of the urethane-based resin are urethane acrylate and the like. Examples of the acrylic resin are butyl acrylate, ethyl hexyl acrylate, or the like. In addition, the sealing member may include a material that is cured by heat. However, embodiments of the present inventive concepts are not limited thereto.

The touch sensor layer 400 may be disposed on the encapsulation layer 300. The touch sensor layer 400 may sense coordinate information according to an external input, for example, a touch event. The touch sensor layer 400 may include a sensor electrode and touch wires connected to the sensor electrode. The touch sensor layer 400 may sense an external input by using a self-capacitive method or a mutual capacitive method.

In an embodiment, the touch sensor layer 400 may be formed on the encapsulation layer 300. Alternatively, the touch sensor layer 400 may be separately formed on a touch substrate and then bonded to the encapsulation layer 300 through an adhesive layer such as an optically clear adhesive. In an embodiment, the touch sensor layer 400 may be directly formed on the encapsulation layer 300. In this embodiment, the adhesive layer may not be disposed between the touch sensor layer 400 and the encapsulation layer 300.

The optical functional layer 500 may be arranged on the touch sensor layer 400. The optical functional layer 500 may reduce reflectance of light (e.g., external light) incident from the outside toward the display device 1, and/or increase the color purity of light emitted from the display device 1. In an embodiment, the optical functional layer 500 may include a retarder and a polarizer. The retarder may be of a film type or a liquid crystal coating type, and may include a λ/2 retarder and/or a λ/4 retarder. The polarizer may also be a film type or a liquid crystal coating type. The film type may include a stretched synthetic resin film, and the liquid crystal coating type may include liquid crystals arranged in a certain arrangement. The retarder and polarizer may each further include a protective film.

In another embodiment, the optical functional layer 500 may include a black matrix and color filters. The color filters may be arranged based on the color of light emitted from each of the organic light-emitting diodes OLED. For example, each of the color filters may include a red, green, or blue pigment or dye. In an embodiment, each of the color filters may further include quantum dots in addition to the aforementioned pigment or dye. In an embodiment, some of the color filters may not include the aforementioned pigments or dyes, and may include scattering particles such as titanium oxide.

In another embodiment, the optical functional layer 500 may include a destructive interference structure. The destructive interference structure may include a first reflective layer and a second reflective layer, which are on different layers. First reflected light and second reflected light respectively reflected by the first reflective layer and the second reflective layer may destructively interfere with each other, and accordingly, the reflectance of external light may be reduced.

As shown in the embodiment of FIG. 2, the display panel 10 may have a hole 10H. In an embodiment, the substrate 100, the buffer layer 111, the insulating layer IL, the encapsulation layer 300, the touch sensor layer 400, and the optical functional layer 500 may respectively have first through sixth holes. The first through sixth holes may overlap each other to form the hole 10H of the display panel 10. For example, the first through sixth holes may overlap each other in a third direction that extends parallel to the z axis (e.g., the z direction or the −z direction) and is a thickness direction of the substrate 100. The third direction may intersect both the first and second directions. In another embodiment, at least one of the substrate 100, the buffer layer 111, the insulating layer IL, the encapsulation layer 300, the touch sensor layer 400, and the optical functional layer 500 may not have a hole. For example, any one or two components selected from the substrate 100, the buffer layer 111, the insulating layer IL, the encapsulation layer 300, the touch sensor layer 400, and the optical functional layer 500 may not have a hole.

The window 20 may be disposed on the display panel 10. In an embodiment, the window 20 may be combined with an underlying structure, for example, the optical functional layer 500, through an adhesive such as an optically clear adhesive (OCA). The window 20 may protect the display panel 10. In an embodiment, the window 20 may include at least one material selected from glass, sapphire, and plastic. The window 20 may be, for example, an ultra-thin glass (UTG) or a colorless polyimide (CPI).

The component 30 may overlap the component area CA. The component 30 may include an electronic element. For example, the component 30 may include an electronic element that uses light or sound. For example, the electronic element may include a sensor that receives and uses light, such as an infrared sensor, a camera capturing an image by receiving light, a sensor outputting and sensing light or sound to measure a distance or recognize a fingerprint or the like, a small lamp outputting light, a speaker outputting sound, or the like. An electronic element that uses light may utilize light of various wavelengths such as visible light, infrared light, ultraviolet light, or the like. In an embodiment, the component area CA may include a transmission area through which light output from the component 30 to the outside or light output from the outside toward the electronic element may pass.

In another embodiment, when the display device 1 is used as a smart watch or an instrument panel for vehicles, the component 30 may be a member of the instrument panel, such as the hand of a clock or a needle indicating certain information (e.g., the speed of a vehicle or the like). When the display device 1 includes the hand of a clock or the instrument panel for vehicles, the component 30 may be exposed to the outside through the window 20, and the window 20 may include an opening overlapping the component area CA.

The component 30 may include component(s) that add certain function(s) to the display device 1, or may include components such as accessories that increase the aesthetics of the display panel 10.

Figure 3:
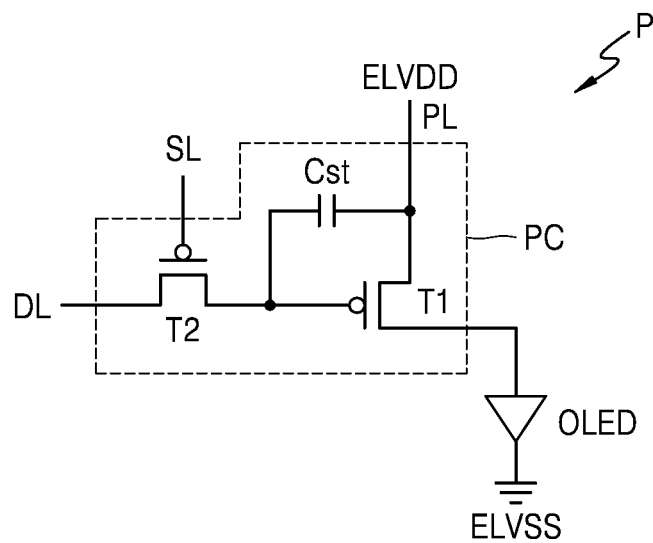
FIG. 3 is an equivalent circuit diagram of a pixel according to an embodiment of the present inventive concepts.

FIG. 3 is a schematic equivalent circuit diagram of the pixel P according to an embodiment of the present inventive concepts.

Referring to the embodiment of FIG. 3, the pixel P may include the pixel circuit PC and the organic light-emitting diode OLED as a display element.

The pixel circuit PC may include a driving thin-film transistor T1, a switching thin-film transistor T2, and a storage capacitor Cst. Each pixel P may emit, for example, red, green, or blue light or may emit red, green, blue, or white light, from the organic light-emitting diode OLED. However, embodiments of the present inventive concepts are not limited thereto and the pixel P may emit various different colors.

The switching thin-film transistor T2 may be connected to a scan line SL and a data line DL. The switching thin-film transistor T2 may be configured to deliver, to the driving thin-film transistor T1, a data signal or data voltage input from the data line DL based on a scan signal or a switching voltage input from the scan line SL. The storage capacitor Cst may be connected to the switching thin-film transistor T2 and a driving voltage line PL, and may store a voltage corresponding to a difference between a voltage received from the switching thin-film transistor T2 and a first power voltage ELVDD supplied to the driving voltage line PL.

The driving thin-film transistor T1 may be connected to the driving voltage line PL and the storage capacitor Cst, and may control a driving current flowing through from the driving voltage line PL to the organic light-emitting diode OLED in accordance with a voltage value stored in the storage capacitor Cst. The organic light-emitting diode OLED may emit light having a certain brightness according to the driving current. An opposite electrode (e.g., a cathode) of the organic light-emitting diode OLED may receive a second power supply voltage ELVSS. However, embodiments of the present inventive concepts are not limited to the arrangement of the pixel circuit shown in FIG. 3.

Figure 4:
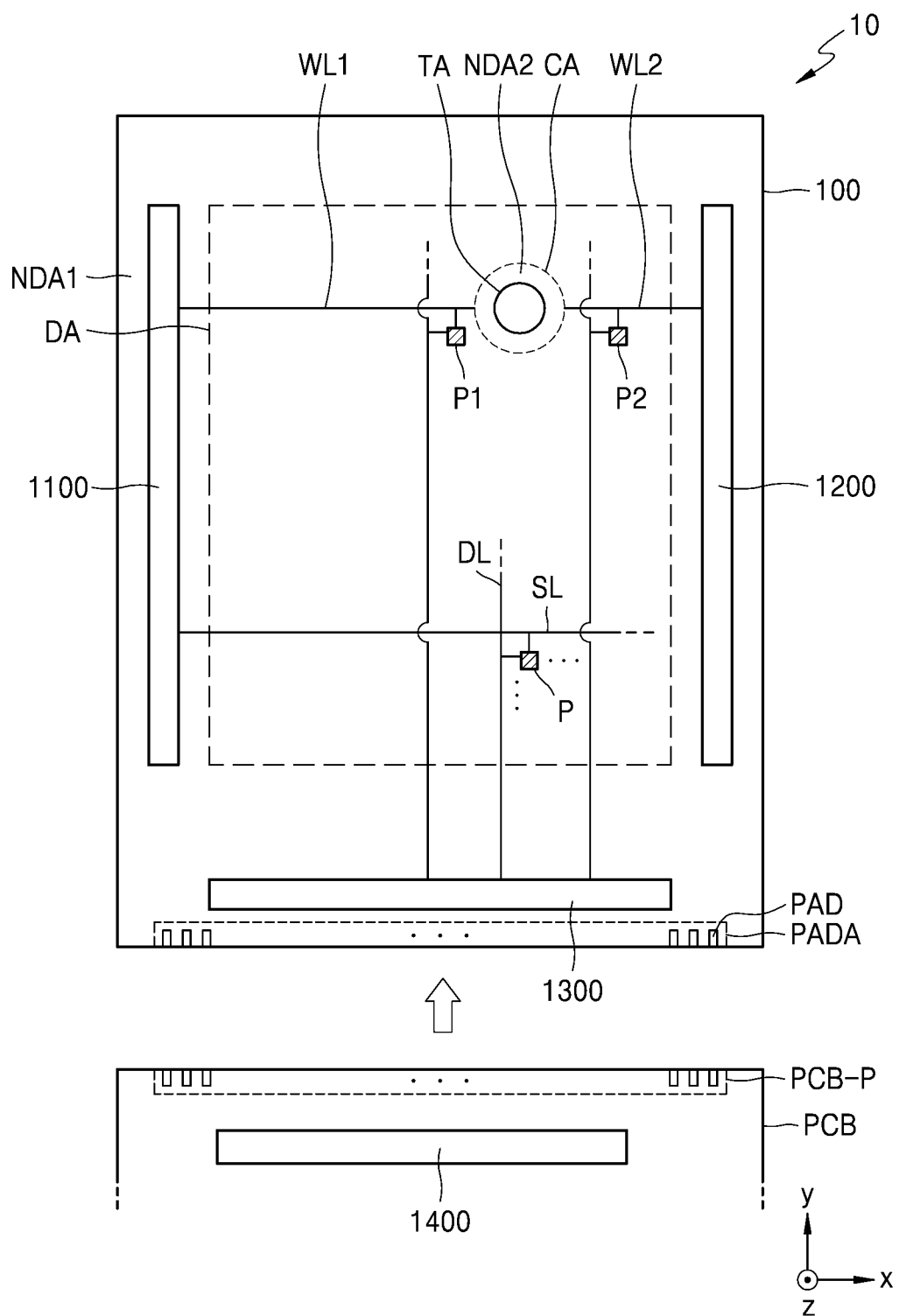
FIG. 4 is a plan view of a display panel according to an embodiment of the present inventive concepts.
Figure 5:
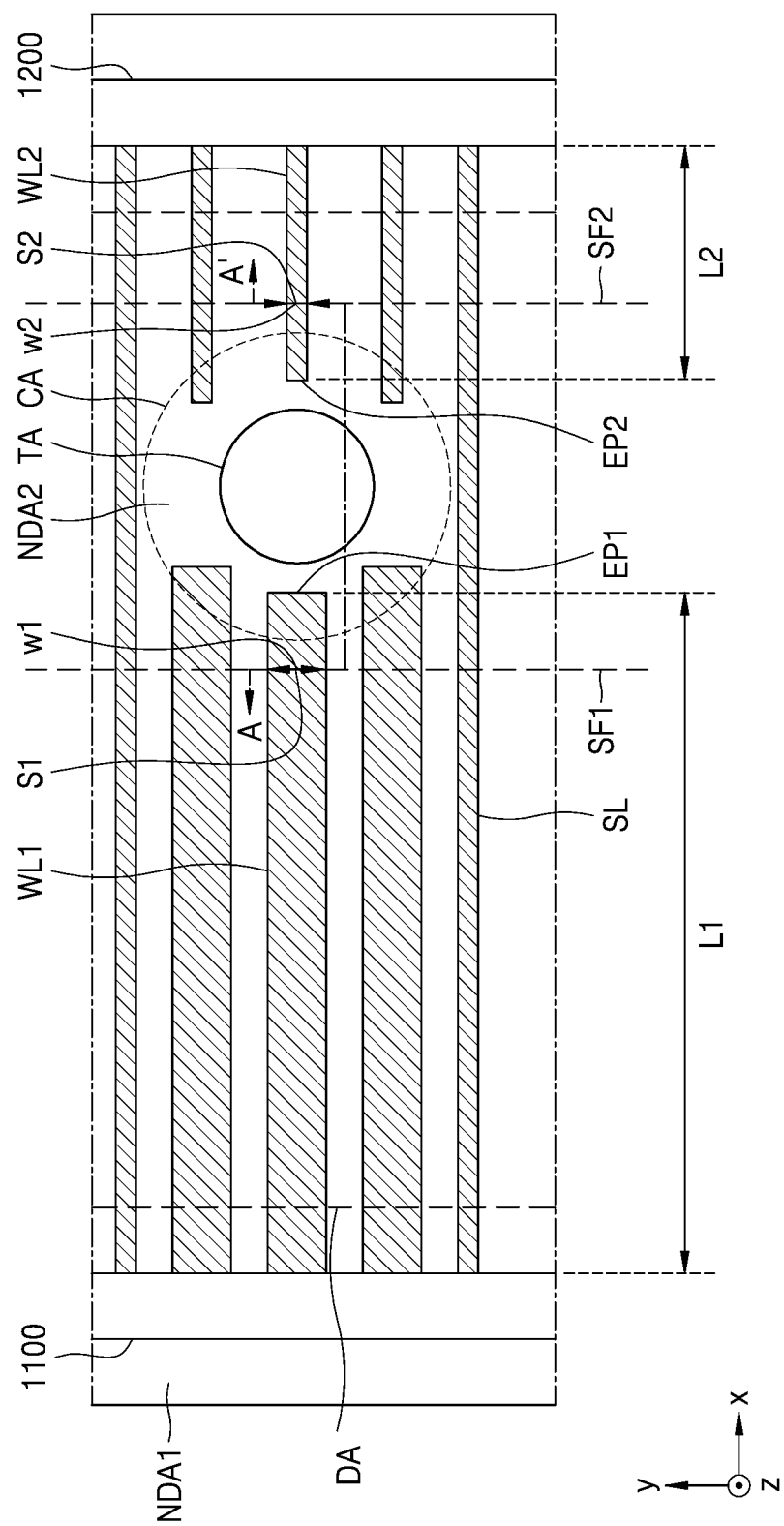
FIG. 5 is a plan view of a portion of a display panel according to an embodiment of the present inventive concepts.

FIG. 4 is a schematic plan view of the display panel 10 according to an embodiment of the present inventive concepts. FIG. 5 is a schematic plan view of a portion of a display panel according to an embodiment of the present inventive concepts.

Referring to FIGS. 4 and 5, the display panel 10 may include the substrate 100, a first scan driver 1100, a second scan driver 1200, a data driver 1300, a first wiring WL1, a second wiring WL2, and the pixel P. The display panel 10 may be electrically connected to a circuit board terminal unit PCB-P of a printed circuit board PCB.

The substrate 100 may include the component area CA, the display area DA, and the first non-display area NDA1. The component area CA may be an area in which a component, which is an electronic element is disposed. The component area CA may be arranged to be offset to the left or right side of the display panel 10 in the first direction (e.g., the x direction or the −x direction). In addition, the component area CA may be arranged in various positions, such as at an upper side, a center, or a lower side of the display panel 10 in the second direction (e.g., the y direction or the −y direction). The component area. CA may include a transmission area TA and a second non-display area NDA2.

The transmission area TA may be at least partially surrounded by the second non-display area NDA2 (e.g., in the first and second directions). For example, as shown in the embodiment of FIG. 4, the transmission are TA is fully surrounded by the second non-display area NDA2. The transmission area TA may be an area through which light of a sensor or light traveling toward a camera passes. The pixel P may not be arranged in the transmission area TA. Accordingly, a high transmittance may be maintained. The second non-display area NDA2 may be arranged between the transmission area TA and the display area DA. In an embodiment, a signal line providing a signal to the pixels P disposed around the transmission area TA may pass by the second non-display area NDA2.

The plurality of pixels P may be arranged in the display area DA, and the plurality of pixels P may display an image. The display area DA may at least partially surround the component area CA. In an embodiment, the display area DA may entirely surround the component area CA (e.g., in the first and second directions).

The first non-display area NDA1 may at least partially surround the display area DA. In an embodiment, the first non-display area NDA1 may entirely surround the display area DA (e.g., in the first and second directions). The first scan driver 1100 and the second scan driver 1200, which provide a scan signal to each pixel P, may be disposed in the first non-display area NDA1. The data driver 1300 providing a data signal to each pixel P may be disposed in the first non-display area NDA1. The first non-display area NDA1 may include a pad area PDA in which a plurality of pads PAD are arranged. The plurality of pads PAD may be electrically connected to terminals of the circuit board terminal unit PCB-P.

The first scan driver 1100 and the second scan driver 1200 may be spaced apart from each other with the display area DA therebetween. The first scan driver 1100 and the second scan driver 1200 may face each other with the display area DA therebetween. The first scan driver 1100 and the second scan driver 1200 may be connected to the scan line SL, the first wiring WL1, and the second wiring WL2, which are connected to each pixel P. In an embodiment, the first scan driver 1100 may be connected to the first wiring WL1. The second scan driver 1200 may be connected to the second wiring WL2. The scan line SL may be connected to the first scan driver 1100 and/or the second scan driver 1200.

The scan line SL, the first wiring WL1, and the second wiring WL2 may provide a scan signal to the pixel P. The scan line SL, the first wiring WL1, and the second wiring WL2 may extend in the first direction (e.g., the x direction or the −x direction) from the first scan driver 1100 or the second scan driver 1200. The scan line SL may be spaced apart from the component area CA in the second direction (e.g., the y direction or the −y direction).

In an embodiment, the first wiring WL1 may extend longitudinally substantially in the first direction (e.g., the x direction or the −x direction) and may face the component area CA. For example, one end of the first wiring WL1 may extend into the second non-display area NDA2 of the component area CA. The first wiring WL1 may extend substantially in the first direction, such as the x direction, from the first non-display area NDA1 to the component area CA. In an embodiment, the first wiring WL1 may be connected to the first scan driver 1100 in the first non-display area NDA1.

The first wiring WL1 may be disposed in the display area DA. The first wiring WL1 may extend longitudinally from the first non-display area NDA1 to the display area DA (e.g., in the x direction). The first wiring WL1 may be connected to the pixel P in the display area DA. In an embodiment, the first wiring WL1 may supply a scan signal to the pixel P.

The first wiring WL1 may be arranged to face the component area CA. For example, as shown in the embodiment of FIG. 5, an end portion EP1 of the first wiring WL1 may face the component area CA. In an embodiment, a portion of the first wiring WL1 may overlap the component area CA. For example, the end portion EP1 of the first wiring WL1 may overlap the second non-display area NDA2. In another embodiment, the end portion EP1 of the first wiring WL1 may be spaced apart from the component area CA. For example, the end portion EP1 of the first wiring WL1 may be spaced apart from the second non-display area NDA2.

In an embodiment, a plurality of first wirings WL1 may be included in the display area DA. Each of the plurality of first wirings WL1 may face the component area CA.

The second wiring WL2 may extend longitudinally in the first direction (e.g., the x direction or the −x direction) and may face the component area CA. The second wiring WL2 may extend longitudinally substantially in the first direction, such as the −x direction, from the first non-display area NDA1 to the component area CA. In an embodiment, the second wiring WL2 may be connected to the second scan driver 1200 in the first non-display area NDA1.

The second wiring WL2 may be disposed in the display area DA. The second wiring WL2 may extend from the first non-display area NDA1 to the display area DA. The second wiring WL2 may be connected to the pixel P in the display area DA. The second wiring WL2 may provide a scan signal to the pixel P.

The second wiring WL2 may be arranged to face the component area CA. In an embodiment, an end portion EP2 of the second wiring WL2 may face the component area CA. In an embodiment, a portion of the second wiring WL2 may overlap the component area CA. For example, as shown in the embodiment of FIG. 5, the end portion EP2 of the second wiring WL2 may overlap the second non-display area NDA2. In another embodiment, the end portion EP2 of the second wiring WL2 may be spaced apart from the component area CA. For example, an end portion EP2 of the second wiring WL2 may be spaced apart from the second non-display area NDA2.

In an embodiment, a plurality of second wirings WL2 may be included in the display area DA. Each of the plurality of second wirings WL2 may face the component area CA.

The first wiring WL1 and the second wiring WL2 may be spaced apart from each other (e.g., in the first direction) with the component area CA therebetween. In an embodiment, the end portion EP1 of the first wiring WL1 and the end portion EP2 of the second wiring WL2 may face each other with the component area CA therebetween. In an embodiment, the plurality of first wirings WL1 and the plurality of second wirings WL2 may be arranged to correspond to each other. In this embodiment, the plurality of first wirings WL1 and the plurality of second wirings WL2 may face each other with the component area CA therebetween.

In an embodiment, the first wiring WL1 and the second wiring WL2 may not be connected by bypassing along an edge of the transmission area TA in the second non-display area NDA2. In a comparative example, when the first wiring WL1 and the second wiring WL2 bypass along the edge of the transmission area TA in the second non-display area NDA2, an increased area of the second non-display area NDA2 may be required. In the present embodiment, since the first wiring WL1 and the second wiring WL2 are arranged to be spaced apart from each other with the component area CA therebetween, the area of the second non-display area NDA2 may be reduced.

In an embodiment, a first length L1 of the first wiring WL1 may be different from a second length L2 of the second wiring WL2. The first length L1 of the first wiring may be a length (e.g., in the x direction) from the first scan driver 1100 to the end portion EP1 of the first wiring WL1. The second length L2 of the second wiring WL2 may be a length (e.g., in the −x direction) from the second scan driver 1200 to the end portion EP2 of the second wiring WL2. In an embodiment, the first length L1 of the first wiring WL1 may be greater than the second length L2 of the second wiring WL2. In this embodiment, the component area CA may be positioned towards the right side of the display panel 10. As shown in the embodiment of FIG. 5, the first length L1 of the first wiring WL1 may be less than the second length L2 of the second wiring WL2. In this embodiment, the component area CA may be positioned towards the left side of the display panel 10.

A cross-sectional area S1 of the first wiring WL1 crossing in the second direction (e.g., the y direction or the −y direction) may be different from a cross-sectional area S2 of the second wiring WL2 crossing in the second direction (e.g., the y direction or the −y direction). The cross-sectional area S1 of the first wiring WL1 may be a cross-sectional area of the first wiring WL1 (e.g., an area of a surface of the first wiring WL1 defined in a plane extending in the second and third directions) overlapping a surface SF1 crossing the first wiring WL1 in the second direction (e.g., the y direction or the −y direction). The cross-sectional area S2 of the second wiring WL2 (e.g., an area of a surface of the second wiring WL2 defined in a plane extending in the second and third directions) may be a cross-sectional area of the second wiring WL2 overlapping a surface SF2 crossing the second wiring WL2 in the second direction (e.g., the y direction or the −y direction). As shown in the embodiment of FIG. 5, the surface SF1 crossing the first wiring WL1 and the surface SF2 crossing the second wiring WL2 may be spaced apart from each other in the first direction (e.g., the x direction or the −x direction). For example, the component area CA may be interposed therebetween.

In an embodiment, the cross-sectional area S1 of the first wiring WL1 crossing in the second direction (e.g., the y direction or the −y direction) may be greater than the cross-sectional area S2 of the second wiring WL2 crossing in the second direction (e.g., the y direction or the −y direction). In the embodiment of FIG. 5, the first length L1 of the first wiring WL1 may be greater than the second length L2 of the second wiring WL2. In another embodiment, the cross-sectional area S1 of the first wiring WL1 crossing in the second direction (e.g., the y direction or the −y direction) may be less than the cross-sectional area S2 of the second wiring WL2 crossing in the second direction (e.g., the y direction or the −y direction). In this embodiment, the first length L1 of the first wiring WL1 may be less than the second length L2 of the second wiring WL2.

In an embodiment, a first width w1 of the first wiring WL1 in the second direction (e.g., the y direction or the −y direction) may be greater than a second width w2 of the second wiring WL2 in the second direction (e.g., the y direction or the −y direction). The first width w1 of the first wiring WL1 may be defined as a length of the first wiring WL1 overlapping the surface SF1 crossing the first wiring WL1. The second width w2 of the second wiring WL2 may be defined as a length of the second wiring WL2 overlapping the surface SF2 crossing the second wiring WL2.

The pixel P may be disposed in the display area DA. For example, the plurality of pixels P may be arranged in the display area DA. In an embodiment, the plurality of pixels P may be spaced apart from each other with the component area CA therebetween. For example, as shown in the embodiment of FIG. 4, a first pixel P1 and a second pixel P2 may be spaced apart from each other with the component area CA therebetween. The first pixel P1 and the second pixel P2 may be pixels P arranged around the component area CA.

The pixel P may be connected to the scan line SL and the data line DL. In an embodiment, the pixel P may be connected to one of the first wiring WL1 and the second wiring WL2. For example, as shown in the embodiment of FIG. 4, the first pixel P1 may be connected to the first wiring WL1, and the second pixel P2 may be connected to the second wiring WL2.

In a comparative embodiment, when the cross-sectional area S1 of the first wiring WL1 is the same as the cross-sectional area S2 of the second wiring WL2, a resistance of the first wiring WL1 may be greater than a resistance of the second wiring WL2. The difference in the resistance of the first and second wirings WL1, WL2 in the comparative embodiment is based on a resistance value being proportional to a length of a wiring. In this comparative embodiment, a delay may occur between a signal transferred to the first pixel P1 connected to the first wiring WL1 and the second pixel P2 connected to the second wiring WL2. Accordingly, there may be a luminance difference between light emitted from a display element of the first pixel P1 and light emitted from a display element of the second pixel P2.

In the present embodiment, the cross-sectional area S1 of the first wiring WL1 crossing in the second direction (e.g., the y direction or the −y direction) may be different from the cross-sectional area S2 of the second wiring WL2 crossing in the second direction (e.g., the y direction or the −y direction). Accordingly, a difference in resistance between the resistance of the first wiring WL1 and the resistance of the second wiring WL2 may be reduced, and the luminance difference between light emitted from the display element of the first pixel P1 and light emitted from the display element of the second pixel P2 may be reduced.

The data driver 1300 may be arranged adjacent to one side of the substrate 100. For example, as shown in the embodiment of FIG. 4, the data driver 1300 may be disposed on a bottom surface of the substrate 100 (e.g., in the second direction). In another embodiment, the data driver 1300 may be disposed on the printed circuit board PCB. Hereinafter, an embodiment in which the data driver 1300 is disposed adjacent to one side of the substrate 100 will be mainly described in detail for convenience of explanation.

The data line DL may provide a data signal to the pixel P. The data line DL may extend longitudinally substantially in the second direction (e.g., the y direction or the −y direction) from the data driver 1300.

In an embodiment, a power supply unit 1400 may be disposed on the printed circuit board PCB. The power supply unit 1400 may provide the first power supply voltage ELVDD (see FIG. 3) and/or the second power supply voltage ELVSS (see FIG. 3) to each pixel P. In another embodiment, the power supply unit 1400 may be disposed in the first non-display area NDA1.

Figure 6:
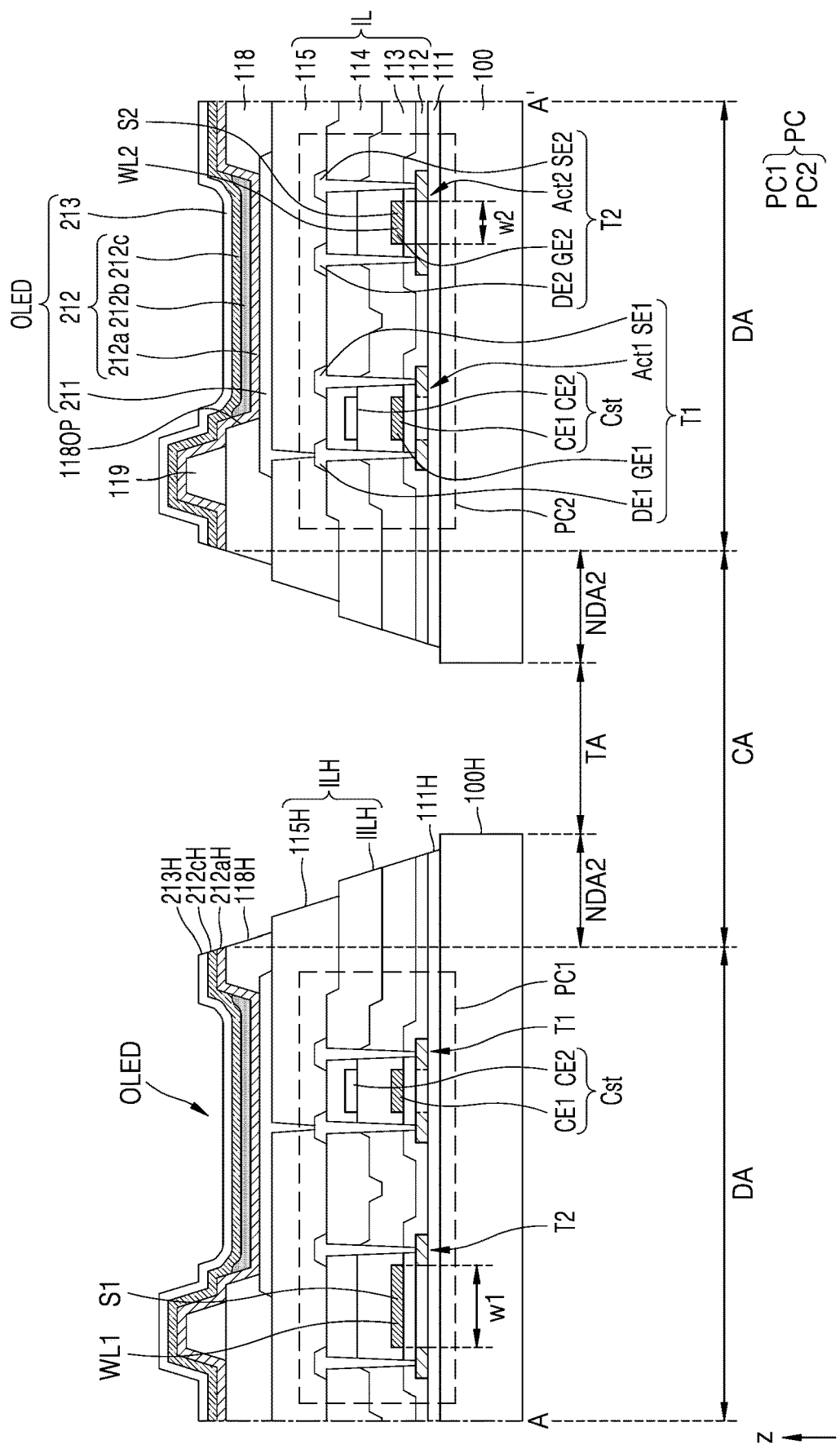
FIG. 6 is a cross-sectional view of a display panel according to an embodiment of the present inventive concepts.

FIG. 6 is a cross-sectional view of a display panel according to an embodiment. FIG. 6 is a cross-sectional view of the display panel taken along line A-A' of FIG. 5.

Referring to FIG. 6, the display panel may include the substrate 100, the buffer layer 111, the first wiring WL1, the second wiring WL2, the insulating layer IL, the pixel circuit PC, and the organic light-emitting diode OLED as the display element. The pixel circuit PC may include the driving thin-film transistor T1, the switching thin-film transistor T2, and the storage capacitor Cst. The insulating layer IL may include a first gate insulating layer 112, a second gate insulating layer 113, an interlayer insulating layer 114, and an organic insulating layer 115.

The buffer layer 111 may be disposed on the substrate 100. In an embodiment, the buffer layer 111 may include an inorganic insulating material such as silicon nitride ($SiN_x$), silicon oxynitride (SiON), and silicon oxide ($SiO_2$), and may include a single layer or a multi-layer, each including the above-stated inorganic insulating material.

The driving thin-film transistor T1 may include a first semiconductor layer Act1, a first gate electrode GE1, a first drain electrode DE1, and a first source electrode SE1.

The first semiconductor layer Act1 may be disposed on the buffer layer 111. In an embodiment, the first semiconductor layer Act1 may include polysilicon. Alternatively, the first semiconductor layer Act1 may include at least one compound selected from an amorphous silicon, an oxide semiconductor, an organic semiconductor, or the like. The first semiconductor layer Act1 may include a channel area and a drain area and a source area arranged on both sides of the channel area.

The first gate electrode GE1 may be disposed above the first semiconductor layer Act1. The first gate electrode GE1 may overlap the channel area of the first semiconductor layer Act1. The first gate electrode GE1 may include a low-resistance metal material. For example, the first gate electrode GE1 may include a conductive material such as at least one compound selected from molybdenum (Mo), aluminum (Al), copper (Cu), titanium (Ti), chromium (Cr), silver (Ag), nickel (Ni), tungsten (W), indium (In), zinc (Zn), and the like, and may include a multi-layer or a single layer, each including the above-stated material. In an embodiment, the first gate electrode GE1 may include at least one compound selected from Ti, silicon (Si), niobium (Nb), tantalum (Ta), W, In, and Zn, and may include a multi-layer or a single layer, each including the above-stated material. In an embodiment, the first gate electrode GE1 may include an oxide of at least one compound selected from Ti, Si, Nb, Ta, W, In, and Zn, or may include a nitride of at least one compound selected from Ti, Si, Nb, Ta, W, In, and Zn, and may include a multi-layer or a single layer, each including the above-stated material.

The first gate insulating layer 112 between the first semiconductor layer Act1 and the first gate electrode GE1 may include an inorganic insulating material such as at least one compound selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZaO), and the like.

The second gate insulating layer 113 may be arranged to cover the first gate electrode GE1. Similar to the first gate insulating layer 112, the second gate insulating layer 113 may include an inorganic, insulating material such as at least one compound selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), and the like.

An upper electrode CE2 of the storage capacitor Cst may be disposed on the second gate insulating layer 113. The upper electrode CE2 may overlap the first gate electrode GE1 (e.g., in the z direction). The first gate electrode GE1 may be positioned below the upper electrode CE2. The first gate electrode GE1 and the upper electrode CE2 overlapping each other, with the second gate insulating layer 113 disposed between the first gate electrode GE1 and the upper electrode CE2, may form the storage capacitor Cst. For example, the first gate electrode GE1 may function as a lower electrode CE1 of the storage capacitor Cst.

As such, the storage capacitor Cst and the driving thin-film transistor T1 may overlap each other (e.g., in the z direction). However, embodiments of the present inventive concepts are not limited thereto and the storage capacitor Cst may not overlap the driving thin-film transistor T1 in some embodiments.

The upper electrode CE2 may include at least one compound selected from Al, platinum (Pt), palladium (Pd), Ag, magnesium (Mg), gold (Au), Ni, neodymium (Nd), iridium (Ir), Cr, calcium (Ca), Mo, Ti, W, and Cu, and may include a single layer or a multi-layer, each including the above-stated material. In an embodiment, the upper electrode CE2 may include at least one compound selected from Ti, Si, Nb, Ta, W, In, and Zn, and may include a single layer or a multi-layer, each including the above-stated material. In an embodiment, the upper electrode CE2 may include at least one compound selected from an oxide of Ti, Si, Nb, Ta, W, In, and Zn or at least one compound selected from a nitride of Ti, Si, Nb, Ta, W, In, and Zn, and may include a single layer or a multi-layer, each including the above-stated material.

The interlayer insulating layer 114 may cover the upper electrode CE2. The interlayer insulating layer 114 may at least one compound selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), and the like. The interlayer insulating layer 114 may include a single layer or a multi-layer, each including the above-stated inorganic insulating materials.

As shown in the embodiment of FIG. 6, each of the first drain electrode DE1 and the first source electrode SE1 may be disposed on the interlayer insulating layer 114. Each of the first drain electrode DE1 and the first source electrode SE1 may be connected to the first semiconductor layer Act1 through contact holes included in the first gate insulating layer 112, the second gate insulating layer 113, and the interlayer insulating layer 114. In an embodiment, the first drain electrode DE1 and the first source electrode SE1 may include a material having relatively good conductivity. For example, the first drain electrode DE1 and the first source electrode SE1 may include a conductive material including at least one compound selected from Mo, Al, Cu, Ti, and the like, and may include a multi-layer or a single layer, each including the above material. In an embodiment, the first drain electrode DE1 and the first source electrode SE1 may have a multi-layered structure of Ti/Al/Ti.

The switching thin-film transistor T2 may include a second semiconductor layer Act2, a second gate electrode GE2, a second drain electrode DE2, and a second source electrode SE2. Since the second semiconductor layer Act2, the second gate electrode GE2, the second drain electrode DE2, and the second source electrode SE2 are substantially similar to the first semiconductor layer Act1, the first gate electrode GE1, the first drain electrode DE1, and the first source electrode SE1 respectively, detailed descriptions thereof will be omitted for convenience of explanation.

The pixel circuit PC may be connected to one of the first wiring WL1 and the second wiring WL2. In an embodiment, a first pixel circuit PC1 may be connected to the first wiring WL1. A second pixel circuit PC2 may be connected to the second wiring WL2. The first wiring WL1 and the second wiring WL2 may be respectively connected to the switching thin-film transistor T2 of the first pixel circuit PC1 and the switching thin-film transistor T2 of the second pixel circuit PC2. In an embodiment, each of the first wiring WL1 and the second wiring WL2 may supply a scan signal to the switching thin-film transistor T2.

In an embodiment, at least one of the first wiring WL1 and the second wiring WL2 may be disposed between the first gate insulating layer 112 and the second gate insulating layer 113. For example, as shown in the embodiment of FIG. 6, both the first wiring WL1 and the second wiring WL2 may be disposed between the first gate insulating layer 112 and the second gate insulating layer 113. In an embodiment, the at least one of the first wiring WL1 and the second wiring WL2 may be disposed on the same layer as the first gate electrode GE1 and/or the second gate electrode GE2. In an embodiment, the at least one of the first wiring WL1 and the second wiring WL2 may be integrally provided with the second gate electrode GE2.

In another embodiment, the at least one of the first wiring WL1 and the second wiring WL2 may be disposed between the second gate insulating layer 113 and the interlayer insulating layer 114. In this embodiment, the at least one of the first wiring WL1 and the second wiring WL2 may be disposed on the same layer as the upper electrode CE2 of the storage capacitor Cst. In an embodiment, the least one of the first wiring WL1 and the second wiring WL2 may be integrally provided with the second gate electrode GE2, and the second gate electrode GE2 may also be arranged between the second gate insulating layer 113 and the interlayer insulating layer 114.

The cross-sectional area S1 (e.g., an area of a surface defined in a plane extending in the second and third directions) of the first wiring WL1 may be different from the cross-sectional area S2 (e.g., an area of a surface defined in a plane extending in the second and third directions) of the second wiring WL2. In an embodiment, the cross-sectional area S1 of the first wiring WL1 may be greater than the cross-sectional area S2 of the second wiring WL2. In this embodiment, the first width w1 (e.g., length in the second direction) of the first wiring WL1 may be greater than the second width w2 (e.g., length in the second direction) of the second wiring WL2. In another embodiment, the cross-sectional area S1 of the first wiring WL1 may be less than the cross-sectional area S2 of the second wiring WL2. In this embodiment, the first width w1 (e.g., length in the second direction) of the first wiring WL1 may be less than the second width w2 (e.g., length in the second direction) of the second wiring WL2. Accordingly, the difference in resistance between the resistance of the first wiring WL1 and the resistance of the second wiring WL2 may be reduced, and a luminance difference between light emitted from a display element connected to the first pixel circuit PC1 and light emitted from a display element connected to the second pixel circuit PC2 may be reduced.

The organic insulating layer 115 may cover the drain electrode DE and the source electrode SE. In an embodiment, the organic insulating layer 115 may include a general commercial polymer such as poly(methyl methacrylate) (PMMA) and/or polystyrene (PS), a polymer derivative having a phenol group, an acrylic polymer, an imide polymer, an aryl ether polymer, an amide polymer, a fluorine polymer, a p-xylene polymer, a vinyl alcohol polymer, and a mixture thereof.

The organic light-emitting diode OLED may be disposed on the organic insulating layer 115. In an embodiment, the organic light-emitting diode OLED may emit red, green, or blue light, or may emit red, green, blue, or white light. The organic light-emitting diode OLED may include a pixel electrode 211, an intermediate layer 212, and an opposite electrode 213.

The pixel electrode 211 may be disposed on the organic insulating layer 115. The pixel electrode 211 may be electrically connected to the first source electrode SE1 or the first drain electrode DE1 through a contact hole of the organic insulating layer 115. The pixel electrode 211 may include a conductive oxide material such as at least one compound selected from indium tin oxide (ITO), indium zinc oxide (IZO), zinc oxide (ZnO), indium oxide ($In_2O_3$), indium gallium oxide (IGO), and aluminum zinc oxide (AZO). In another embodiment, the pixel electrode 211 may include a reflective film including Ag, Mg, Al, Pt, palladium (Pd), Au, Ni, Nd, Ir, Cr, or a compound thereof. In another embodiment, the pixel electrode 211 may further include a film including at least one compound selected from ITO, IZO, ZnO, and $In_2O_3$ above/below the reflective film stated above. For example, the pixel electrode 211 may have a multi-layered structure of ITO/Ag/ITO.

A pixel defining film 118 having an opening 118OP exposing a central portion of the pixel electrode 211 may be disposed on the pixel electrode 211. In an embodiment, the pixel defining film 118 may include an organic insulating material and/or an inorganic insulating material. The opening 118OP may define an emission area of light emitted from the organic light-emitting diode OLED. For example, a width of the opening 118OP may correspond to a width of the emission area.

A spacer 119 may be disposed on the pixel defining film 118. In an embodiment, the spacer 119 may include an organic insulating material such as polyimide. Alternatively, the spacer 119 may include an inorganic insulating material such as at least one compound selected from silicon nitride ($SiN_x$) and silicon oxide ($SiO_2$), or may include an organic insulating material and an inorganic insulating material.

In an embodiment, the spacer 119 may include a material that is different from the material of the pixel defining film 118. In another embodiment, the spacer 119 may include a material that is the same as the material of the pixel defining film 118. In this embodiment, the pixel defining film 118 and the spacer may be formed together in a mask operation using a halftone mask or the like.

The intermediate layer 212 may be disposed on the pixel defining film 118 and the pixel electrode 211. The intermediate layer 212 may include an emission layer 212b disposed in the opening 118OP of the pixel defining film 118. In an embodiment, the emission layer 212b may include a polymer organic material or a low-molecular-weight organic material which emits light of a color.

A first functional layer 212a and a second functional layer 212c may be respectively disposed below and on the emission layer 212b. In an embodiment, the first functional layer 212a may include a hole transport layer (HTL), or an HTL and a hole injection layer (HIL). In an embodiment, the second functional layer 212c which is a component disposed on the emission layer 212b may be omitted. The second functional layer 212c may include an electron transport layer (ETL) and/or an electron injection layer (EIL). In an embodiment, similar to the opposite electrode 213 to be described later, the first functional layer 212a and/or the second functional layer 212c may be a common layer entirely covering the substrate 100.

The opposite electrode 213 may include a conductive material having a low work function. For example, the opposite electrode 213 may include a (semi)transparent layer, the (semi)transparent layer including Ag, Mg, Al, Pt, Pd, Au, Ni, Nd, Ir, Cr, lithium (Li), Ca, alloys thereof, or the like. Alternatively, the opposite electrode 213 may further include a layer such as ITO, IZO, ZnO, or $In_2O_3$ above the (semi)transparent layer including the above-stated material.

In some embodiments, a capping layer may be further disposed on the opposite electrode 213. In an embodiment, the capping layer may include lithium fluoride (LiF), an inorganic material, or/and an organic material. In an embodiment, an encapsulation layer, a touch sensor layer, and/or an optical functional layer may be disposed on the opposite electrode 213.

The substrate 100 may include the component area CA. The component area CA may be an area that overlaps (e.g., in the z direction) a component which is an electronic element. The component area CA may include the transmission area TA and the second non-display area NDA2.

As shown in the embodiment of FIG. 6, the substrate 100 may include a first hole 100H overlapping the transmission area TA. In this embodiment, the transmission area TA may be an opening area of the substrate 100. However, embodiments of the present inventive concepts are not limited thereto and in another embodiment, the substrate 100 may be continuously disposed in the transmission area TA and the first hole 100H may not include an opening. As shown in the embodiment of FIG. 6, the first hole 100H may have a substantially constant width as the distance from the transmission area TA increases. However, embodiments of the present inventive concepts are not limited thereto.

The buffer layer 111 may have a second hole 111H overlapping (e.g., in the z direction) the transmission area TA. The insulating layer IL may have a third hole ILH overlapping (e.g., in the z direction) the transmission area TA. In an embodiment, the third hole ILH of the insulating layer IL may be formed by overlapping an inorganic insulating layer hole IILH of the first gate insulating layer 112, the second gate insulating layer 113, and the interlayer insulating layer 114 and an organic insulating layer hole 115H of the organic insulating layer 115. However, embodiment of the present inventive concepts are not limited thereto and in some embodiments, the second hole 111H and the third hole ILH may be formed with at least one of the buffer layer 111 and the insulating layer IL continuously disposed in the transmission area TA.

In an embodiment, the first functional layer 212a, the second functional layer 212c, and the opposite electrode 213 may respectively have a first functional layer hole 212aH, a second functional layer hole 212cH, and an opposite electrode hole 213H which overlap (e.g., in the z direction) the transmission area TA. As shown in the embodiment of FIG. 6, the width of the second hole 111H, the third hole ILH, the first functional layer hole 212aH, the second functional layer hole 212cH and the opposite electrode hole 213H, respectively, may increase as the distance from the transmission area TA increases. The width of the second hole 111H may be smaller than the width of the third hole ILH, the width of the third hole ILH may be smaller than the width of the first functional layer hole 212aH, the width of the first functional layer hole 212aH may be smaller than the width of the second functional layer hole 212cH and the width of the second functional layer hole 212cH may be smaller than the width of the opposite electrode hole 213H However, embodiments of the present inventive concepts are not limited thereto. As described above, when some of the components (e.g., layers) are not disposed to overlap the transmission area TA (e.g., in the z direction), the transmittance of the transmission area TA may be increased.

FIGS. 7A to 7E are schematic plan views of a portion of a display panel according to various embodiments of the present inventive concepts. In FIGS. 7A to 7E, the same reference numerals as those in FIG. 5 refer to the same members, and redundant descriptions thereof will be omitted for convenience of explanation.

Referring to the embodiments of FIGS. 7A to 7E, the display panel may include a substrate, the first scan driver 1100, the second scan driver 1200, the first wiring WL1, and the second wiring WL2. The substrate may include the component area CA, the display area DA, and the first non-display area NDA1. The component area CA may include the transmission area TA and the second non-display area NDA2.

The first wiring WL1 and the second wiring WL2 may extend in the first direction (e.g., the x direction or the −x direction), and the first wiring WL1 and the second wiring WL2 may be spaced apart from each other (e.g., in the first direction) with the component area CA therebetween. In an embodiment, the cross-sectional area S1 of the first wiring WL1 crossing in the second direction (e.g., the y direction or the −y direction) may be different from the cross-sectional area S2 of the second wiring WL2 crossing in the second direction (e.g., the y direction or the −y direction). In an embodiment the first width w1 of the first wiring WL1 in the second direction (e.g., the y direction or the −y direction) may be greater than the second width w2 of the second wiring WL2 in the second direction (e.g., the y direction or the −y direction).

A first cross-sectional area S1-1 of the first wiring WL1 (e.g., an area defined in a plane extending in the second and third directions) overlapping a first surface SF1-1 crossing the first wiring WL1 in the second direction (e.g., the y direction or the −y direction) may be different from a second cross-sectional area S1-2 (e.g., an area defined in a plane extending in the second and third directions) of the first wiring WL1 overlapping a second surface SF1-2 crossing the first wiring WL1 in the second direction (e.g., the y direction or the −y direction). The first surface SF1-1 may be spaced apart from the second surface SF1-2 by a certain distance in the first direction (e.g., the x direction or the −x direction). For example, as shown in the embodiment of FIG. 7A, the first surface SF1-1 may be closer to the component area CA than the second surface SF1-2.

In an embodiment, the first cross-sectional area S1-1 of the first wiring WL1 may be greater than the second cross-sectional area S1-2 of the first wiring WL1. In another embodiment, the first cross-sectional area S1-1 of the first wiring WL1 may be less than the second cross-sectional area S1-2 of the first wiring WL1.

A width w1-1 (e.g., length in the second direction) of the first wiring WL1 overlapping the first surface SF1-1 may be different from a width w1-2 (e.g., length in the second direction) of the first wiring WL1 overlapping the second surface SF1-2. In an embodiment, the width w1-1 of the first wiring WL1 overlapping the first surface SF1-1 may be greater than the width w1-2 of the first wiring WL1 overlapping the second surface SF1-2. In another embodiment, the width w1-1 of the first wiring WL1 overlapping the first surface SF1-1 may be less than the width w1-2 of the first wiring WL1 overlapping the second surface SF1-2.

Figure 7A:
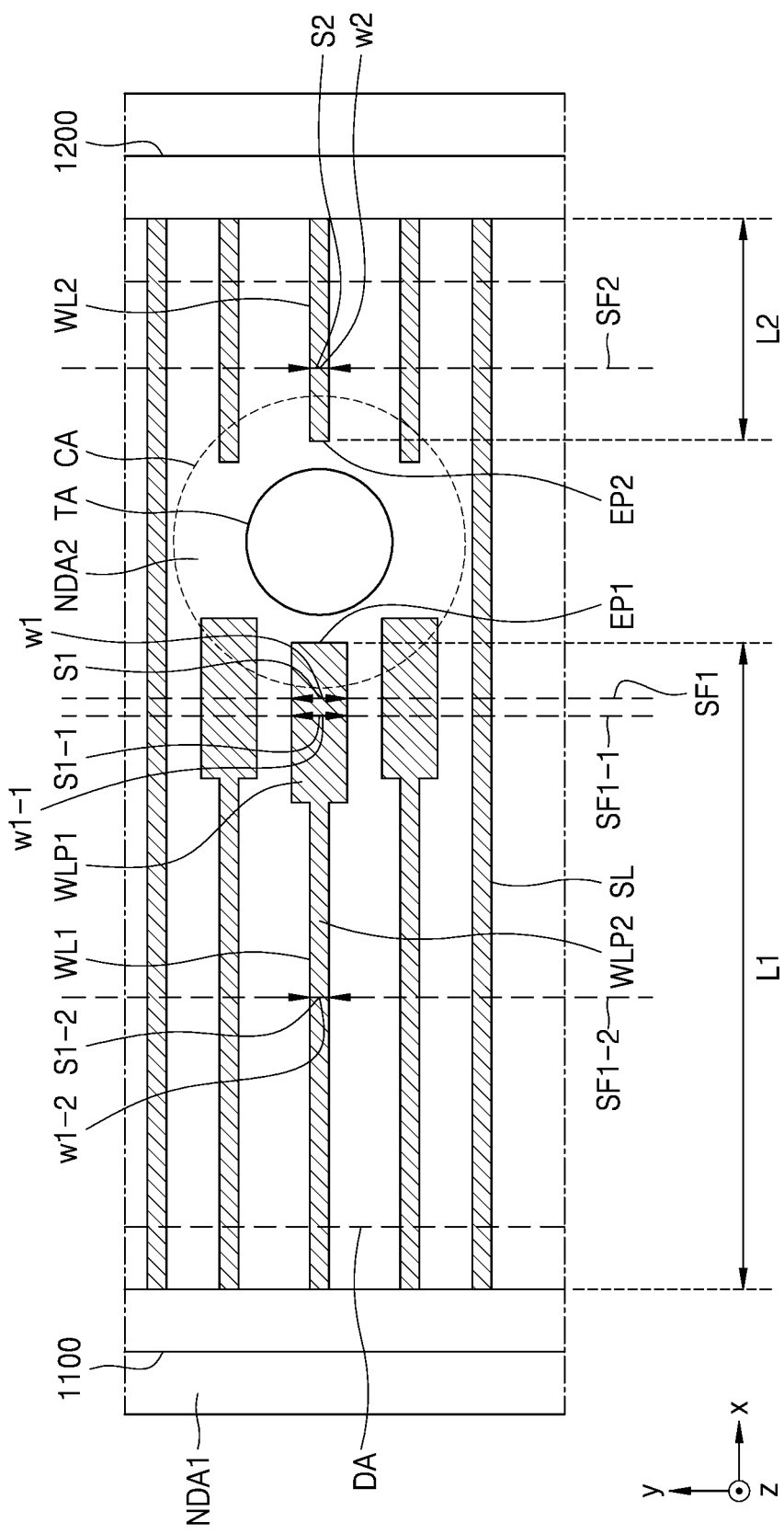
FIGS. 7A to 7E are plan views of a portion of a display panel according to various embodiments of the present inventive concepts.

Referring to the embodiment of FIG. 7A, the first wiring WL1 may include a first portion WLP1 adjacent to the component area CA and a second portion WLP2 that is positioned farther from the component area CA (e.g., in the first direction). A cross-sectional area of the first portion WLP1 may be greater than a cross-sectional area of the second portion WLP2.

Figure 7B:
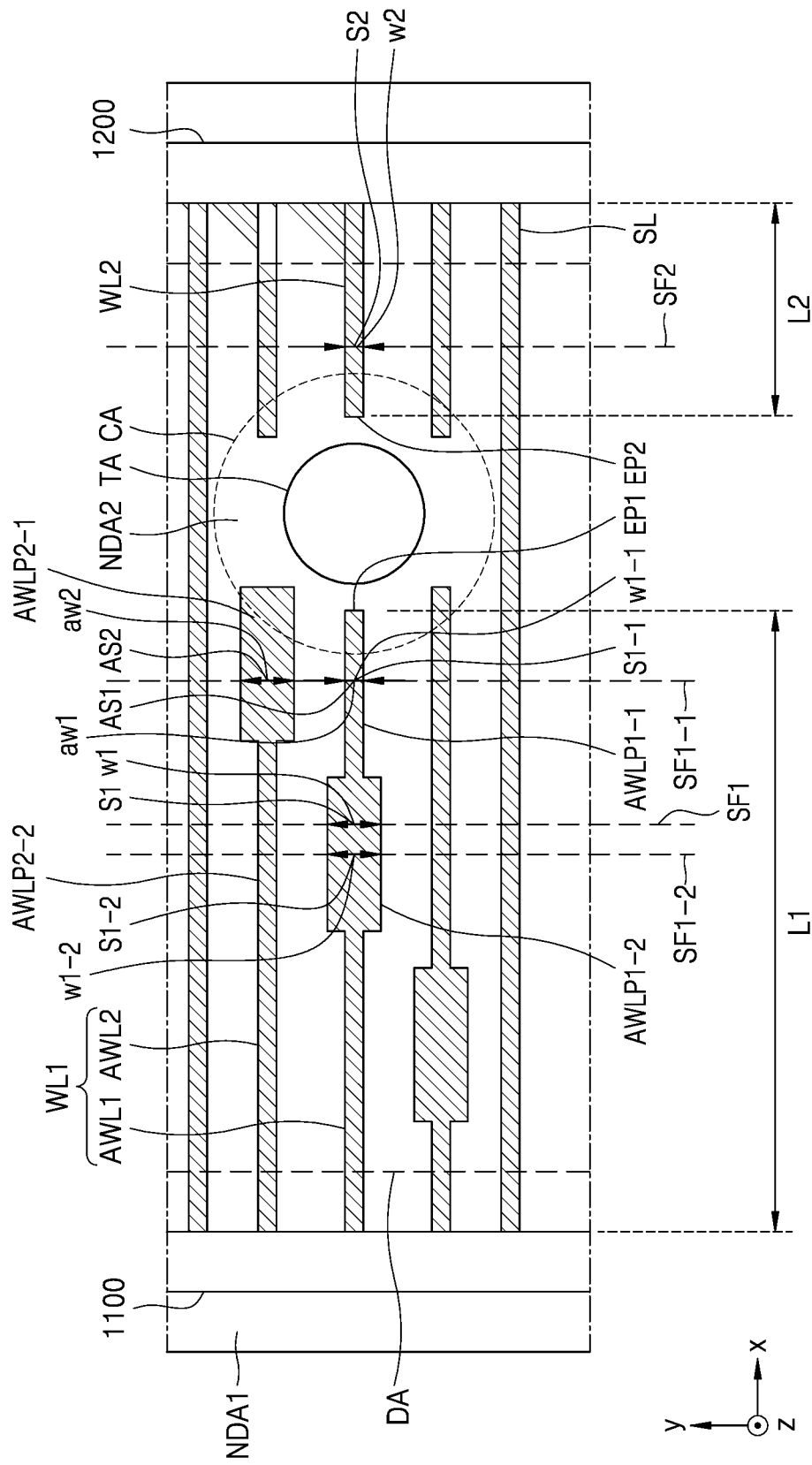

Referring to FIG. 7B, the first wiring WL1 may include a first adjacent wiring AWL1 and a second adjacent wiring AWL2 which are adjacent to each other (e.g., in the second direction). Each of the first adjacent wiring AWL1 and the second adjacent wiring AWL2 may extend longitudinally in the first direction (e.g., the x direction or the −x direction) and may face the component area CA.

A cross-sectional area AS1 of the first adjacent wiring AWL1 overlapping the first surface SF1-1 may be different from a cross-sectional area AS2 of the second adjacent wiring AWL2 overlapping the first surface SF1-1. For example, as shown in the embodiment of FIG. 7B, the cross-sectional area AS1 of the first adjacent wiring AWL1 may be less than the cross-sectional area AS2 of the second adjacent wiring AWL2.

A width aw1 (e.g., length in the second direction) of the first adjacent wiring AWL1 overlapping the first surface SF1-1 may be different from a width aw2 (e.g., length in the second direction) of the second adjacent wiring AWL2 overlapping the first surface SF1-1. For example, the width aw1 of the first adjacent wiring AWL1 overlapping the first surface SF1-1 may be less than the width aw2 of the second adjacent wiring AWL2 overlapping the first surface SF1-1.

A cross-sectional area of the first adjacent wiring AWL1 overlapping the second surface SF1-2 may be different from a cross-sectional area of the second adjacent wiring AWL2 overlapping the second surface SF1-2. For example, as shown in the embodiment of FIG. 7B, the cross-sectional area of the first adjacent wiring AWL1 overlapping the second surface SF1-2 may be greater than the cross-sectional area of the second adjacent wiring AWL2 overlapping the second surface SF1-2.

A width (e.g., length in the second direction) of the first adjacent wiring AWL1 overlapping the second surface SF1-2 may be different from a width (e.g., length in the second direction) of the second adjacent wiring AWL2 overlapping the second surface SF1-2. For example, as shown in the embodiment of FIG. 7B, the width of the first adjacent wiring AWL1 overlapping the second surface SF1-2 may be greater than the width of the second adjacent wiring AWL2 overlapping the second surface SF1-2.

In an embodiment the first adjacent wiring AWL1 may include a first lower adjacent portion AWLP1-1 and a second lower adjacent portion AWLP1-2. The second adjacent wiring AWL2 may include a first upper adjacent portion AWLP2-1 and a second upper adjacent portion AWLP2-2. The first lower adjacent portion AWLP1-1 may face the first upper adjacent portion AWLP2-1. The second lower adjacent portion AWLP1-2 may face the second upper adjacent portion AWLP2-2 and may be spaced apart from each other in the second direction. As shown in the embodiment of FIG. 7B, a cross-section of the first lower adjacent portion AWLP1-1 overlapping the first surface SF1-1 may be less than a cross-section of the first upper adjacent portion AWLP2-1 overlapping the first surface SF1-1. A cross-section of the second lower adjacent portion AWLP1-2 overlapping the second surface SF1-2 may be greater than a cross-section of the second upper adjacent portion AWLP2-2 overlapping the second surface SF1-2.

In the above embodiment, a distance between the first adjacent wiring AWL1 and the second adjacent wiring AWL2 in the second direction (e.g., the y direction or the −y direction) may be greater than a certain distance, such as a predetermined minimum distance, regardless of a cross-section of the first adjacent wiring AWL1 and a cross-section of the second adjacent wiring AWL2. Accordingly, interference between a signal transferred through the first adjacent wiring AWL1 and a signal transferred through the second adjacent wiring AWL2 may be reduced or prevented.

Figure 7C:
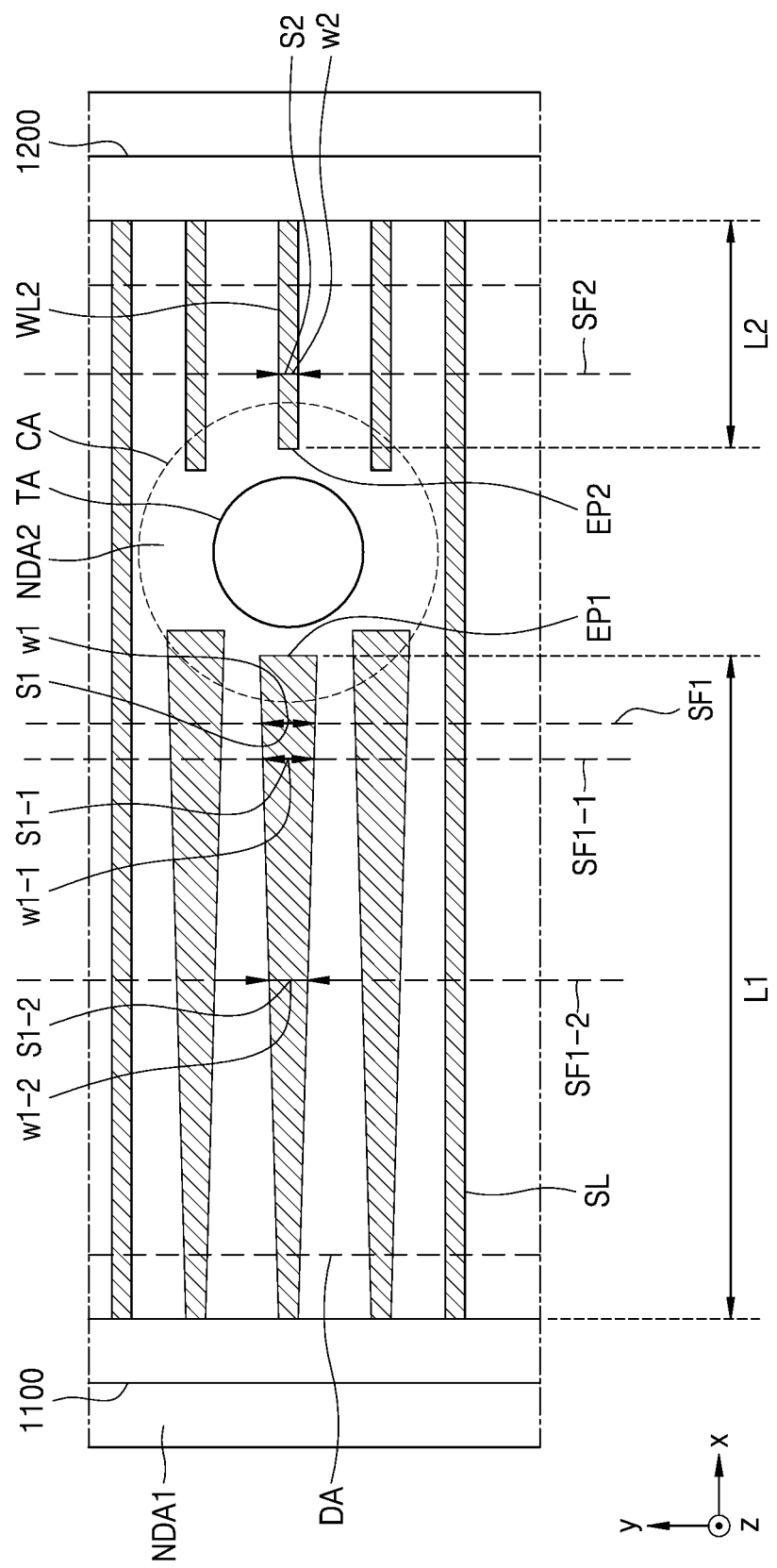

Referring to the embodiment of FIG. 7C, a cross-sectional area of the first wiring WL1 may increase in a direction (e.g., the x direction) towards the component area CA from the first non-display area NDA1. In addition, the first width w1 (e.g., length in the second direction) of the first wiring WL1 may increase in the direction (e.g., the x direction) towards the component area CA from the first non-display area NDA1. Although the embodiment of FIG. 7C illustrates that the cross-sectional area of the first wiring WL1 uniformly increases in the direction towards the component area CA from the first non-display area NDA1, in another embodiment, the cross-sectional area of the first wiring WL1 may gradually increase in the direction (e.g., the x direction) towards the component area CA from the first non-display area NDA1. In another embodiment, the cross-sectional area of the first wiring WL1 may rapidly increase (e.g., increase in a non-uniform manner) in the direction towards the component area CA from the first non-display area NDA1.

Figure 7D:
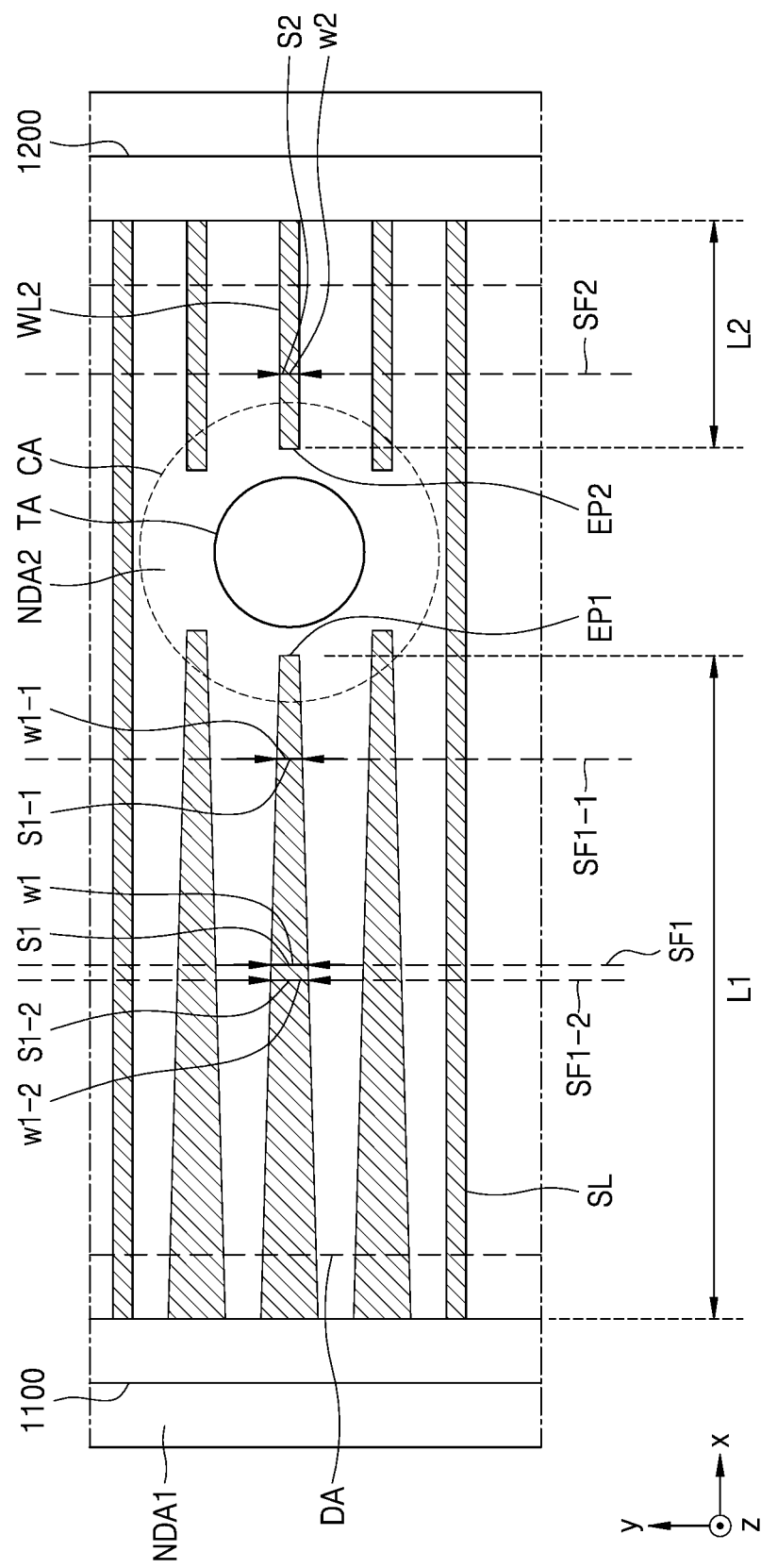

Referring to the embodiment of FIG. 7D, the cross-sectional area of the first wiring WL1 may decrease in the direction towards the component area CA from the first non-display area NDA1. In addition, the first width w1 (e.g., length in the second direction) of the first wiring WL1 may decrease in the direction towards the component area CA from the first non-display area NDA1. Although the embodiment of FIG. 7D illustrates that the cross-sectional area of the first wiring WL1 uniformly decreases in the direction towards the component area CA from the first non-display area NDA1 in another embodiment, the cross-sectional area of the first wiring WL1 may gradually decrease in the direction (e.g., the x direction) towards the component area CA from the first non-display area NDA1. In another embodiment, the cross-sectional area of the first wiring WL1 may rapidly decrease (e.g., decrease in a non-uniform manner) in the direction (e.g., the x direction) towards the component area CA from the first non-display area NDA1.

Figure 7E:
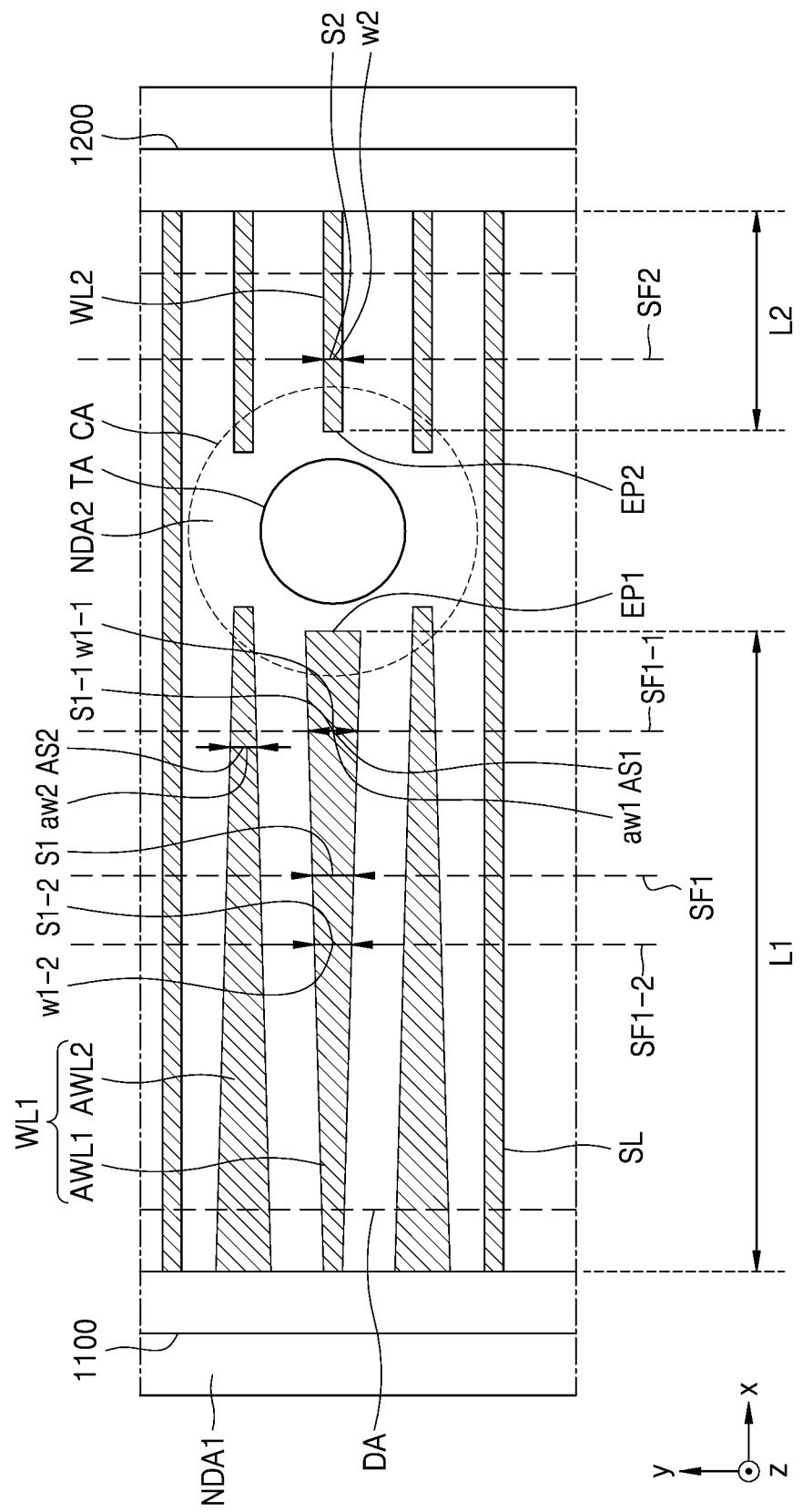

Referring to the embodiment of FIG. 7E, the first wiring WL1 may include the first adjacent wiring AWL1 and the second adjacent wiring AWL2, which are adjacent to each other (e.g., in the second direction). Each of the first adjacent wiring AWL1 and the second adjacent wiring AWL2 may extend longitudinally in the first direction (e.g., the x direction or the −x direction) and may face the component area CA.

The cross-sectional area AS1 of the first adjacent wiring AWL1 overlapping the first surface SF1-1 may be different from the cross-sectional area AS2 of the second adjacent wiring AWL2 overlapping the first surface SF1-1. As shown in the embodiment of FIG. 7E, the width aw1 (e.g., length in the second direction) of the first adjacent wiring AWL1 overlapping the first surface SF1-1 may be different from the width aw2 (e.g., length in the second direction) of the second adjacent wiring AWL2 overlapping the first surface SF1-1. For example, the width aw2 may be less than the width aw1.

The cross-sectional area AS1 of the first adjacent wiring AWL1 may increase in the direction (e.g., the x direction) towards the component area CA from the first non-display area NDA1. The cross-sectional area AS2 of the second adjacent wiring AWL2 may decrease in the direction (e.g., the x direction) towards the component area CA from the first non-display area NDA1. In an embodiment, the width aw1 (e.g., length in the second direction) of the first adjacent wiring AWL1 may increase in the direction (e.g., the x direction) towards the component area CA from the first non-display area NDA1. The width aw2 (e.g., length in the second direction) of the second adjacent wiring AWL2 may decrease in the direction (e.g., the x direction) towards the component area CA from the first non-display area NDA1.

The distance between the first adjacent wiring AWL1 and the second adjacent wiring AWL2 in the second direction (e.g., the y direction or the −y direction) may be greater than a certain distance, such as a predetermined minimum distance, regardless of the cross-section of the first adjacent wiring AWL1 and the cross-section of the second adjacent wiring AWL2. Accordingly, the interference between a signal transferred through the first adjacent wiring AWL1 and a signal transferred through the second adjacent wiring AWL2 may be reduced or prevented. In the embodiments of FIGS. 7A-7E, the width (e.g., length in the second direction) and area of the second wiring WL2 may be substantially uniform (e.g., substantially equal to the second width w2 and cross-sectional area S2) as the second wiring WL2 longitudinally extends in the first direction (e.g., the x direction or the −x direction). However, embodiments of the present inventive concepts are not limited thereto.

Figure 8:
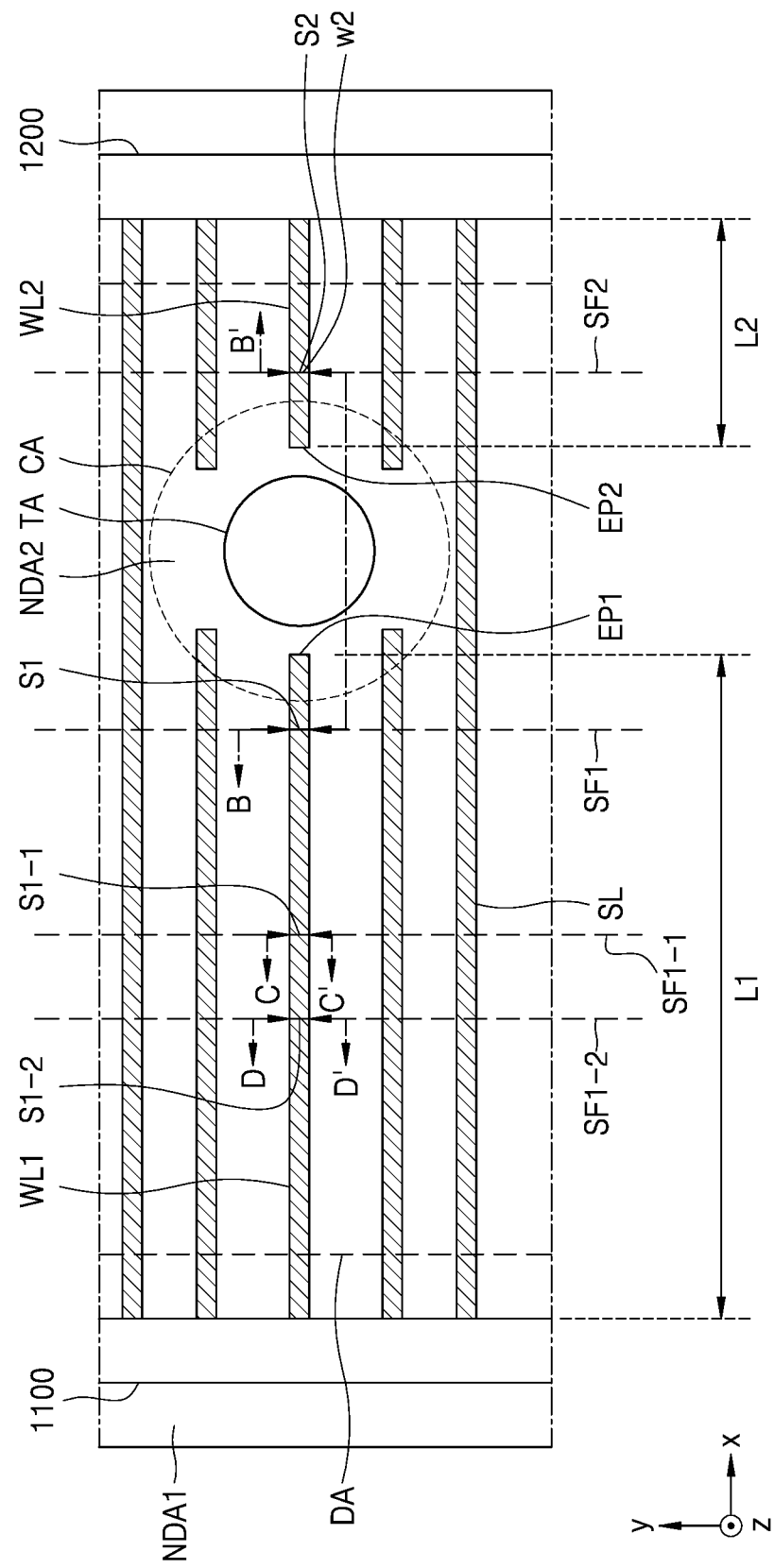
FIG. 8 is a plan view of a portion of a display panel according to another embodiment of the present inventive concepts.
Figure 9:
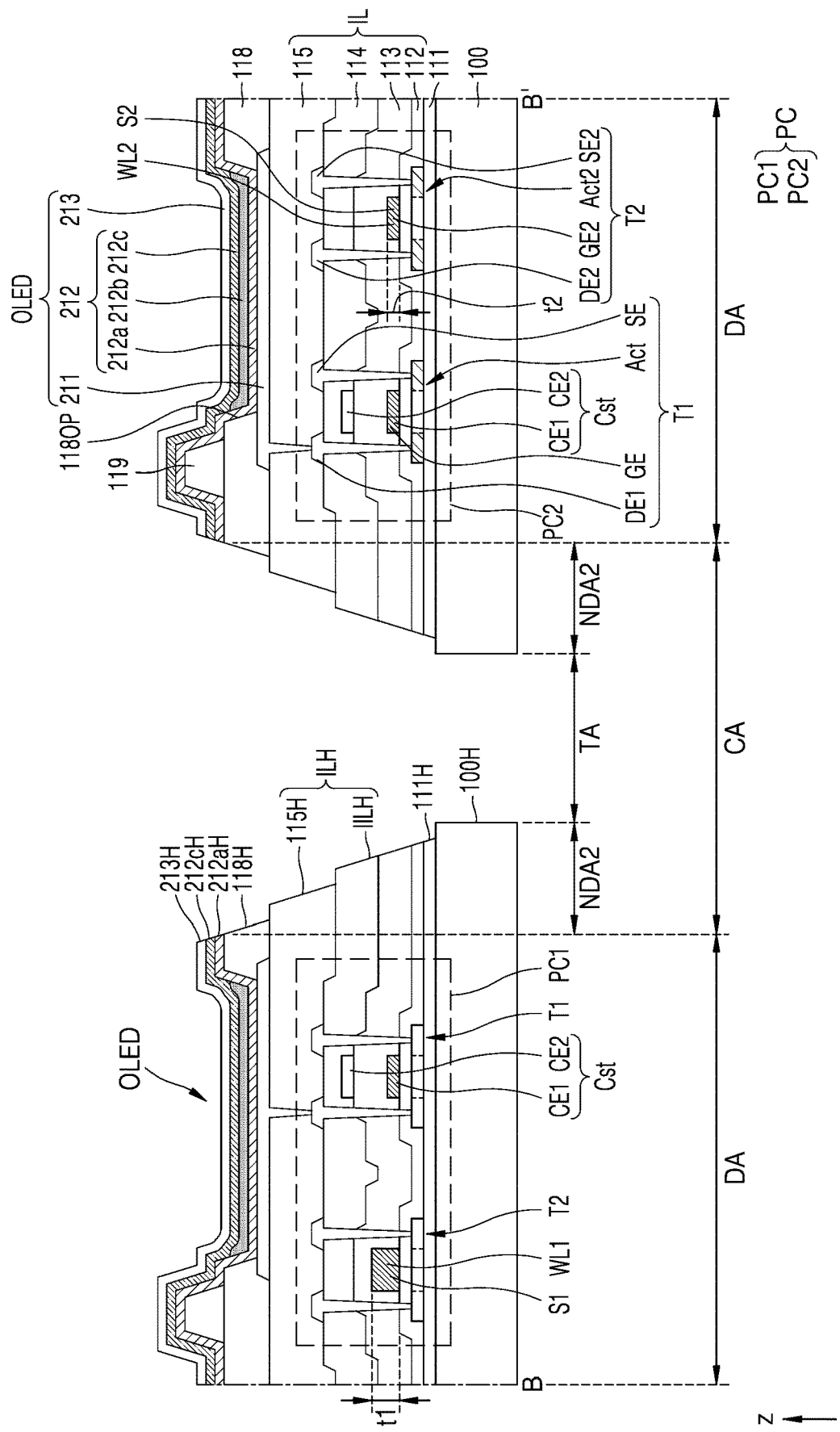
FIG. 9 is a cross-sectional view of a display panel according to another embodiment of the present inventive concepts.
Figure 10:
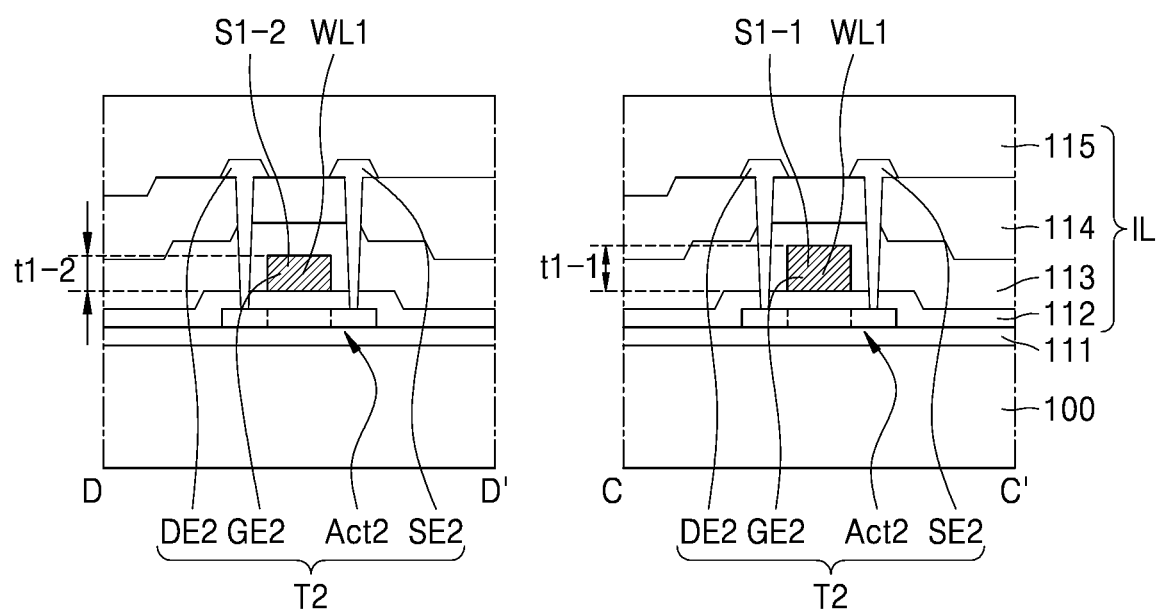
FIG. 10 is a cross-sectional view of a portion of a display panel according to another embodiment of the present inventive concepts.

FIG. 8 is a schematic plan view of a portion of a display panel according to another embodiment. FIG. 9 is a schematic cross-sectional view of a display panel according to another embodiment. FIG. 10 is a schematic cross-sectional view of a portion of a display panel according to another embodiment. FIG. 9 is a cross-sectional view of the display panel taken along line B-B' of FIG. 8. FIG. 10 is a cross-sectional view of the display panel taken along lines C-C' and D-D' of FIG. 8. In the embodiments of FIGS. 8 and 9, the same numerals as those in the embodiments of FIGS. 5 and 6 refer to the same members, and redundant descriptions thereof will be omitted for convenience of explanation.

Referring to the embodiments of FIGS. 8 and 9, the display panel may include the substrate 100, the first wiring WL1, the second wiring WL2, the pixel circuit PC, and the organic light-emitting diode OLED as the display element.

The substrate 100 may include the component area CA, the display area DA, and the first non-display area NDA1. The component area CA may include the transmission area TA and the second non-display area NDA2.

The first wiring WL1 and the second wiring WL2 may extend longitudinally in the first direction (e.g., the x direction or the −x direction), and the first wiring WL1 and the second wiring WL2 may be spaced apart from each other with the component area CA therebetween. In an embodiment, the cross-sectional area S1 of the first wiring WL1 crossing in the second direction (e.g., the y direction or the −y direction) may be different from the cross-sectional area S2 of the second wiring WL2 crossing in the second direction (e.g., the y direction or the −y direction).

A first thickness t1 (e.g., length in the third direction) of the first wiring WL1 may be different from a second thickness t2 (e.g., length in the third direction) of the second wiring WL2. The first thickness t1 of the first wiring WL1 may be a distance between a lower surface of the first wiring WL1 and an upper surface of the first wiring WL1 in the third direction (e.g., the z direction or −z direction). The second thickness t2 of the second wiring WL2 may be a distance between a lower surface of the second wiring WL2 and an upper surface of the second wiring WL2 in the third direction (e.g., the z direction or −z direction).

As shown in the embodiment of FIG. 9, the first thickness t1 of the first wiring WL1 may be greater than the second thickness t2 of the second wiring WL2. However, embodiments of the present inventive concepts are not limited thereto. For example, in another embodiment, the first thickness t1 of the first wiring WL1 may be less than the second thickness t2 of the second wiring WL2.

Accordingly, the difference in resistance between the resistance of the first wiring WL1 and the resistance of the second wiring WL2 may be reduced, and a luminance difference between light emitted from the organic light-emitting diode OLED connected to the first pixel circuit PC1 and light emitted from the organic light-emitting diode OLED connected to the second pixel circuit PC2 may be reduced.

In an embodiment, the first cross-sectional area S1-1 of the first wiring WL1 overlapping the first surface SF1-1 (e.g., an area of a surface of the first wiring WL1 defined in a plane extending in the second and third directions) crossing the first wiring WL1 in the second direction (e.g., the y direction or the −y direction) may be substantially equal to the second cross-sectional area S1-2 (e.g., an area defined in a plane extending in the second and third directions) of the first wiring WL1 overlapping the second surface SF1-2 crossing the first wiring WL1 in the second direction (e.g., the y direction or the −y direction). In another embodiment, the first cross-sectional area S1-1 of the first wiring WL1 overlapping the first surface SF1-1 crossing the first wiring WL1 in the second direction (for example, the y direction or the −y direction) may be different from the second cross-sectional area S1-2 of the first wiring WL1 overlapping the second surface SF1-2 crossing the first wiring WL1 in the second direction (for example, the y direction or the −y direction). For example, in an embodiment, the first wiring WL1 may have a width in the second direction that is different from a width of the second wiring WL2 in the second direction and/or a thickness of the first wiring WL1 in the third direction is different from a thickness of the second wiring WL2 in the third direction. Hereinafter, an embodiment where the first cross-sectional area S1-1 of the first wiring WL1 is different from the second cross-sectional area S1-2 of the second wiring WL2 will be mainly described in detail for convenience of explanation.

The first cross-sectional area S1-1 of the first wiring WL1 may be greater than the second cross-sectional S1-2 of the first wiring WL1 in the second direction (e.g., the y direction or the −y direction). In another embodiment, the first cross-sectional area S1-1 of the first wiring WL1 may be less than the second cross-sectional S1-2 of the first wiring WL1 in the second direction (e.g., the y direction or the −y direction).

A thickness t1-1 of the first wiring WL1 overlapping the first surface SF1-1 may be different from a thickness t1-2 of the first wiring WL1 overlapping the second surface SF1-2. As shown in the embodiment of FIG. 10, the thickness t1-1 of the first wiring WL1 overlapping the first surface SF1-1 may be greater than the thickness t1-2 of the first wiring WL1 overlapping the second surface SF1-2. However, embodiments of the present inventive concepts are not limited thereto and in another embodiment, the thickness t1-1 of the first wiring WL1 overlapping the first surface SF1-1 may be less than the thickness t1-2 of the first wiring WL1 overlapping the second surface SF1-2.

In an embodiment, the cross-sectional area S1 of the first wiring WL1 may increase in the direction towards the component area CA from the first non-display area NDA1. In addition, the first thickness t1 of the first wiring WL1 may increase in the direction towards the component area CA from the first non-display area NDA1.

In another embodiment, the cross-sectional area S1 of the first wiring WL1 may decrease in the direction towards the component area CA from the first non-display area NDA1. In addition, the first thickness t1 of the first wiring WL1 may decrease in the direction towards the component area CA from the first non-display area NDA1.

Figure 11:
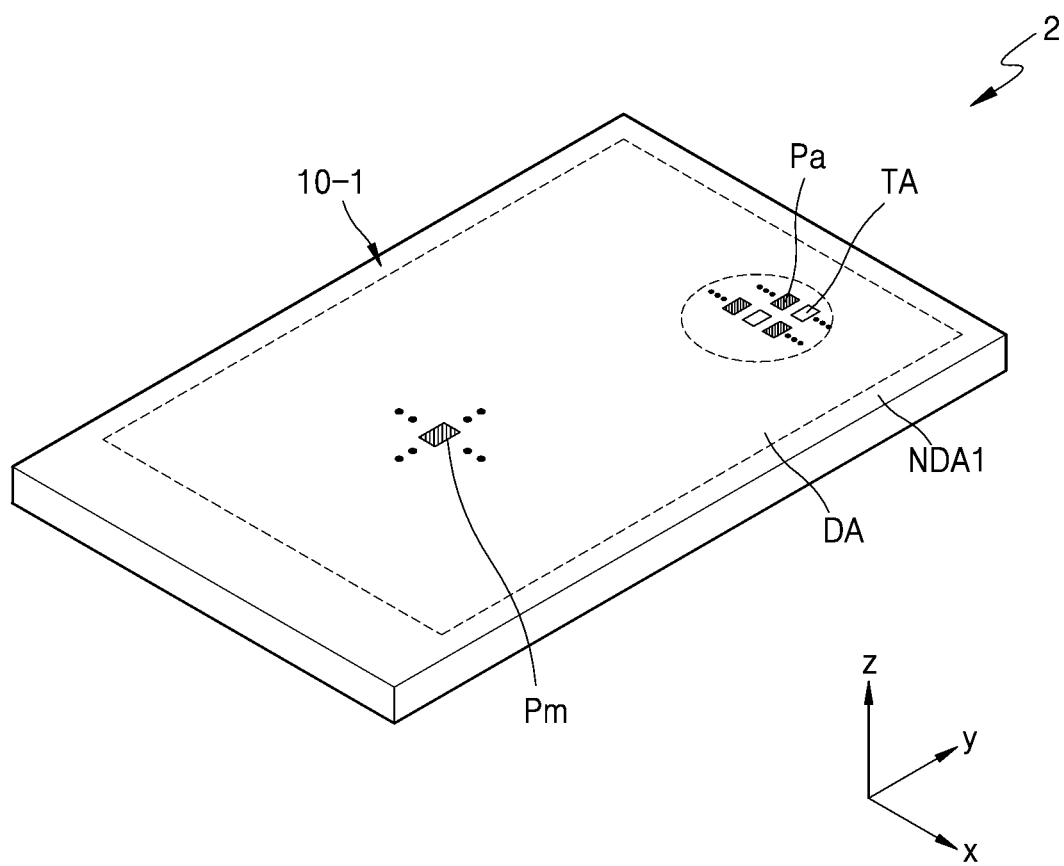
FIG. 11 is a perspective view of a display device according to another embodiment of the present inventive concepts.

FIG. 11 is a schematic perspective view of a display device 2 according to another embodiment. In FIG. 11, the same reference numerals as those in FIG. 1 refer to the same members, and redundant descriptions thereof will be omitted for convenience of explanation.

Referring to the embodiment of FIG. 11, the display device 2 may include a display panel 10-1. The display panel 10-1 may include the display area DA, the component area CA, and the first non-display area NDA1.

The display area DA may produce an image. A main pixel Pm may be disposed in the display area DA. The main pixel Pm may include a main display element. In an embodiment, a plurality of main pixels Pm may be disposed in the display area DA. However, for convenience of illustration, FIG. 11 shows a single main pixel Pm.

The component area CA may produce an image, and a component may be disposed in the component area CA. An auxiliary pixel Pa and a plurality of transmission areas TA may be arranged in the component area CA. The auxiliary pixel Pa may include an auxiliary display element. In an embodiment, the auxiliary pixel Pa may be disposed between the plurality of transmission areas TA, which are adjacent to each other.

Figure 12:
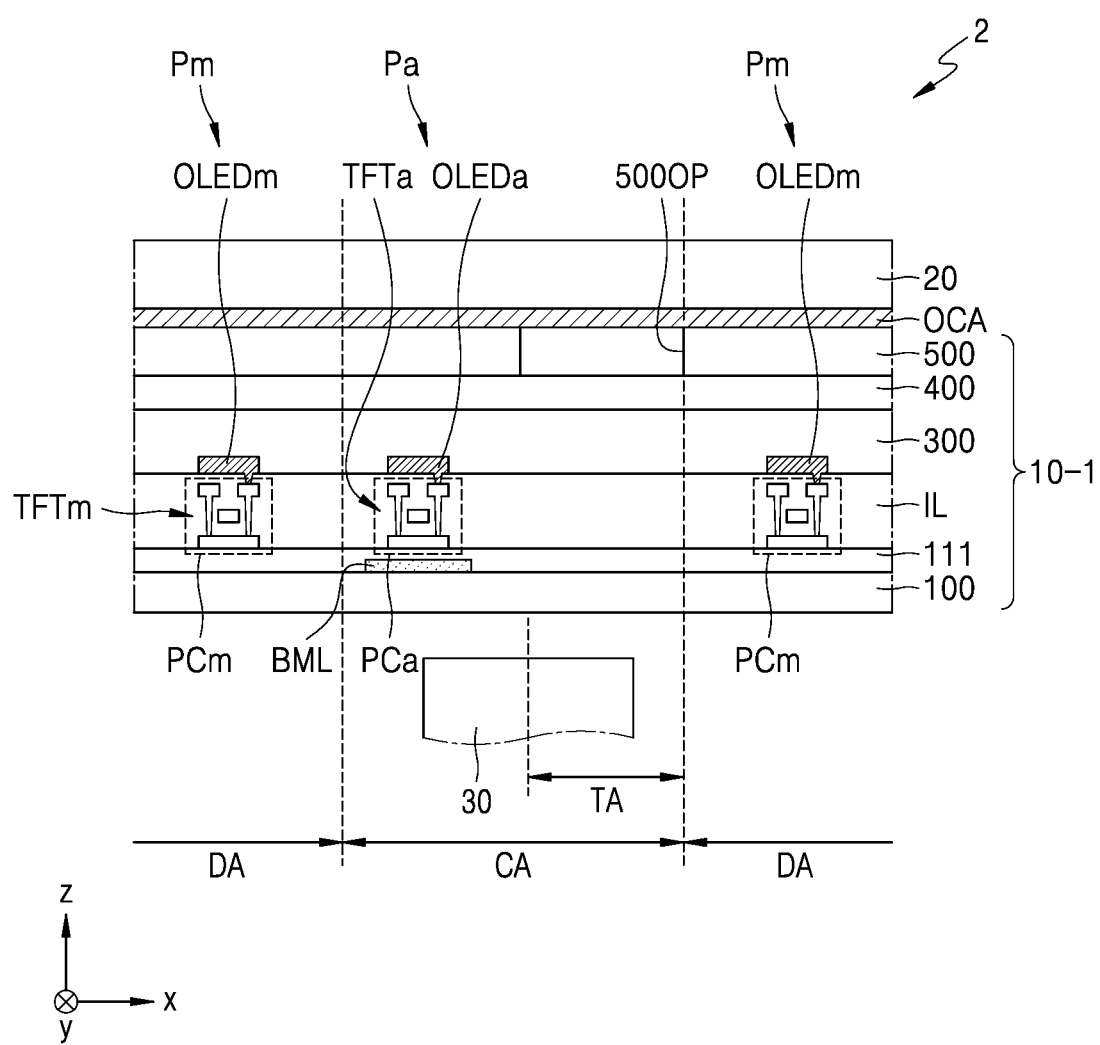
FIG. 12 is a cross-sectional view of a display device according to another embodiment of the present inventive concepts.

FIG. 12 is a schematic cross-sectional view of the display device 2 according to another embodiment.

Referring to the embodiment of FIG. 12, the display device 2 may include the display panel 10-1, the window 20, and the component 30. The display panel 10-1 may include the substrate 100, a lower metal layer BML, the buffer layer 111, the encapsulation layer 300, the touch sensor layer 400, and the optical functional layer 500.

The substrate 100 may include the display area DA and the component area CA. The main pixel Pm may be disposed in the display area DA. The main pixel Pm may include a main pixel circuit PCm and a main organic light-emitting diode OLEDm connected to the main pixel circuit PCm. The main pixel circuit PCm may include at least one main thin-film transistor TFTm. The component area CA may include the plurality of transmission areas TA, and the auxiliary pixel Pa may be arranged between the plurality of transmission areas TA which are adjacent to each other. The auxiliary pixel Pa may include an auxiliary pixel circuit PCa and an auxiliary organic light-emitting diode OLEDa connected to the auxiliary pixel circuit PCa. The auxiliary pixel circuit PCa may include at least one auxiliary thin-film transistor TFTa. The plurality of transmission areas TA may overlap the component 30 (e.g., in the third direction). FIG. 12 illustrates only one transmission area TA for convenience of illustration The plurality of transmission areas TA may be areas through which light signals emitted from the component 30 or light/signals incident to the component 30 are transmitted.

The lower metal layer BML may be disposed in the component area CA. The lower metal layer BML may be arranged to correspond to a lower portion of the auxiliary thin-film transistor TFTa. The lower metal layer BML may block external light from reaching the auxiliary thin-film transistor TFTa. In some embodiments, an electrostatic voltage or a signal may be applied to the lower metal layer BML to prevent a pixel circuit from being damaged by electrostatic discharge. A plurality of lower metal layers BML may be arranged in the component area CA, and in some embodiments, different voltages may be applied to each of the plurality of lower metal layers BML. One lower metal layer BML having a hole corresponding to the transmission area TA may be located in the component area CA. Although FIG. 12 illustrates that the lower metal layer BML is disposed on the substrate 100, such as a top surface of the substrate 100, in some embodiments, the lower metal layer BML may be inserted in the substrate 100 and a lower surface of the lower metal layer BML may be positioned below an upper surface of the substrate 100.

In an embodiment, the optical functional layer 500 may have an opening 500OP overlapping the plurality of transmission areas TA (e.g., in the third direction). Accordingly, the light transmittance of the plurality of transmission areas TA may be increased. In an embodiment, a transparent material, such as an optically clear resin (OCR), may be filled in the opening 500OP overlapping the plurality of transmission areas TA.

Figure 13:
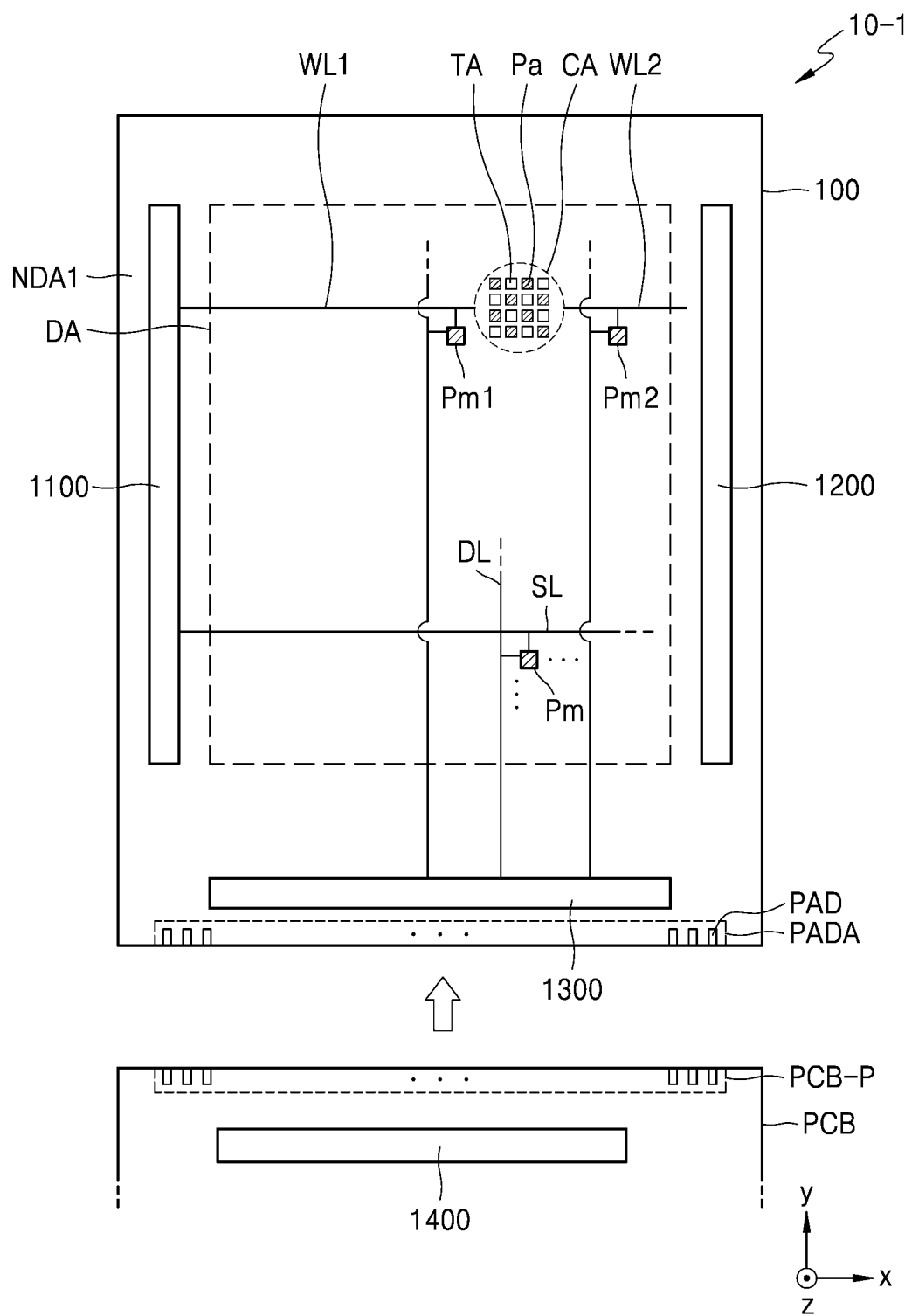
FIG. 13 is a schematic plan view of a display panel according to another embodiment of the present inventive concepts.
Figure 14:
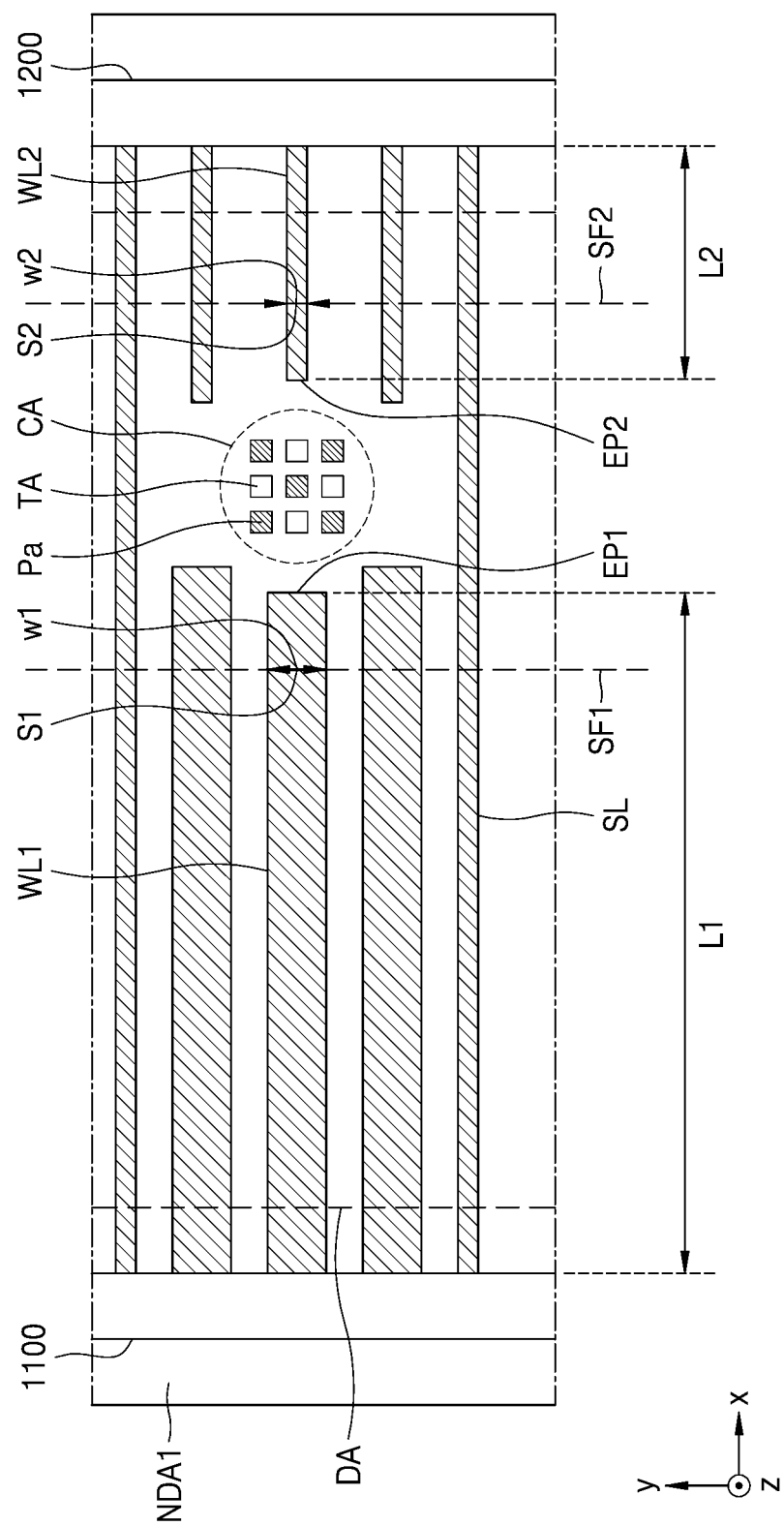
FIG. 14 is a plan view of a display panel according to another embodiment of the present inventive concepts.

FIG. 13 is a schematic plan view of a display panel 10-1 according to another embodiment. FIG. 14 is a schematic plan view of a display panel according to another embodiment. In FIGS. 13 and 14, the same numerals as those in FIGS. 4 and 5 refer to the same members, and redundant descriptions thereof will be omitted for convenience of explanation.

Referring to the embodiment of FIG. 13, the display panel 10-1 may include the substrate 100, the first scan driver 1100, the second scan driver 1200, the data driver 1300, the first wiring WL1, the second wiring WL2, the main pixel Pm, and the auxiliary pixel Pa. The display panel 10-1 may be electrically connected to the circuit board terminal unit PCB-P of the printed circuit board PCB.

The substrate 100 may include the component area CA, the display area DA, and the first non-display area NDA1.

The plurality of main pixels Pm may be disposed in the display area DA, and the plurality of main pixels Pm may display an image.

The component area CA may be an area in which a component, which is an electronic element, is disposed. The component area CA may be arranged to be offset to the left or right side of the display panel 10-1 in the first direction (e.g., the x direction or the −x direction). The plurality of transmission areas TA may be arranged in the component area CA. In addition, the auxiliary pixel Pa may be arranged in the plurality of transmission areas TA, which are adjacent to each other. In an embodiment, a plurality of auxiliary pixels Pa may be disposed in the component area CA.

The first wiring WL1 may extend longitudinally in the first direction (e.g., the x direction or the −x direction) and may face the component area CA. The first wiring WL1 may be connected to a first main pixel Pm1 in the display area DA. In an embodiment, the first wiring WL1 may supply a scan signal to the first main pixel Pm1. The first main pixel Pm1 may be the main pixel Pm arranged around the component area CA. In an embodiment, the first wiring WL1 may be electrically connected to the auxiliary pixel Pa. For example, in an embodiment, the first wiring WL1 may be bridged to the auxiliary pixel Pa.

The second wiring WL2 may extend longitudinally in the first direction (e.g., the x direction or the −x direction) and may face the component area CA. The second wiring WL2 may be connected to a second main pixel Pm2 in the display area DA. In an embodiment, the second wiring WL2 may provide a scan signal to the second main pixel Pm2. The second main pixel Pm2 may be the main pixel Pm arranged around the component area CA. In an embodiment, the second wiring WL2 may be electrically connected to the auxiliary pixel Pa. For example, in an embodiment, the second wiring WL2 may be bridged to the auxiliary pixel Pa.

The first wiring WL1 and the second wiring WL2 may be spaced apart from each other (e.g., in the first direction) with the component area CA therebetween. In an embodiment, the end portion EP1 of the first wiring WL1 and the end portion EP2 of the second wiring WL2 may face each other.

The first length L1 of the first wiring WL1 and the second length L2 of the second wiring WL2 may be different. In addition, the cross-sectional area S1 (e.g., an area defined in a plane extending in the second and third directions) of the first wiring WL1 crossing in the second direction (e.g., the y direction or the −y direction) may be different from the cross-sectional area S2 (e.g., an area defined in a plane extending in the second and third directions) of the second wiring WL2 crossing in the second direction (e.g., the y direction or the −y direction). In an embodiment, the first width w1 (e.g., length in the second direction) of the first wiring WL1 may be different from the second width w2 (e.g., length in the second direction) of the second wiring WL2. In another embodiment, a first thickness of the first wiring WL1 in the third direction (e.g., the z direction or the −z direction) may be different from a second thickness of the second wiring WL2 in the third direction (e.g., the z direction or the −z direction).

Accordingly, a difference in resistance between the resistance of the first wiring WL1 and the resistance of the second wiring WL2 may be reduced, and luminance difference between light emitted from a main display element of the first main pixel Pm1 and light emitted from a main display element of the second main pixel Pm2 may be reduced.

According to the above descriptions, embodiments of the present inventive concepts may include a first wiring and a second wiring which are connected to a pixel circuit including at least one thin-film transistor and spaced apart from each other with a component area therebetween, and a cross-sectional area of the first wiring may be different from a cross-sectional area of the second wiring. Accordingly, the first wiring and the second wiring may be arranged around the component area, and luminance deviation of display elements emitting light may be reduced.

It should be understood that embodiments described herein should be considered in a descriptive sense only and not for purposes of limitation. Descriptions of features of aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined b the following claims.

What is claimed is:

1. A display panel comprising:
a substrate including a component area, a display area at least partially surrounding the component area, and a first non-display area at least partially surrounding the display area;
a first wiring in the display area and extending in a first direction to face the component area;
a second wiring in the display area and extending in the first direction to face the component area, the second wiring is spaced apart from the first wiring with the component area therebetween, wherein the first and second wirings are extended along a same imaginary straight line in the first direction;
a pixel circuit connected to one of the first wiring and the second wiring and comprising at least one thin-film transistor; and
a display element connected to the pixel circuit,
wherein a width of the first wiring in a second direction that is perpendicular to the first direction is different from a width of the second wiring in the second direction.

2. The display panel of claim 1, wherein the first wiring extends in the first direction a first length that is different from a second length that the second wiring extends in the first direction.

3. The display panel of claim 2, wherein:
the first length is greater than the second length; and
the width of the first wiring in the second direction is greater than the width of the second wiring in the second direction.

4. The display panel of claim 1, wherein:
the at least one thin-film transistor comprises a semiconductor layer on the substrate and a gate electrode on the semiconductor layer; and
the first wiring and the second wiring are on the same layer as the gate electrode.

5. The display panel of claim 1, further comprising,
a first scan driver and a second scan driver in the first non-display area and spaced apart from each other with the display area therebetween;
wherein the first wiring is directly connected to the first scan driver; and
the second wiring is directly connected to the second scan driver.

6. The display panel of claim 1, wherein a first cross-sectional area of the first wiring overlapping a first surface crossing the first wiring in the second direction is different from a second cross-sectional area of the first wiring overlapping a second surface that is parallel to the first surface and spaced apart from the first surface in the first direction.

7. The display panel of claim 6, wherein:
the first wiring comprises a first adjacent wiring and a second adjacent wiring that are adjacent to each other in the second direction; and
a cross-sectional area of the first adjacent wiring overlapping the first surface is different from a cross-sectional area of the second adjacent wiring overlapping the first surface.

8. The display panel of claim 1, wherein a first thickness of the first wiring in a third direction that is perpendicular to the first direction and the second direction is different from a second thickness of the second wiring in the third direction.

9. The display panel of claim 1, wherein:
the display area entirely surrounds the component area;
the component area includes a transmission area and a second non-display area between the transmission area and the display area; and
the display element is in the display area.

10. The display panel of claim 1, wherein:
the component area comprises a plurality of transmission areas;
the display element comprises a main display element and an auxiliary display element;
the main display element is in the display area; and
the auxiliary display element is between the plurality of transmission areas that are adjacent to each other in the component area.

11. A display device comprising:
a substrate including a component area, a display area surrounding the component area, and a first non-display area at least partially surrounding the display area;
a first wiring in the display area and extending in a first direction to face the component area;
a second wiring in the display area and extending in the first direction to face the component area, the second wiring is spaced apart from the first wiring with the component area therebetween, wherein the first and second wirings are extended along a same imaginary straight line in the first direction;
a pixel circuit connected to one of the first wiring and the second wiring and comprising at least one thin-film transistor;
a display element connected to the pixel circuit; and
a component overlapping the component area,
wherein a width of the first wiring in a second direction that is perpendicular to the first direction is different from a width of the second wiring in the second direction.

12. The display device of claim 11, wherein:
the first wiring extends in the first direction a first length that is greater than a second length that the second wiring extends in the first direction; and
the width of the first wiring in the second direction is greater than the width of the second wiring in the second direction.

13. The display device of claim 11, wherein:
the at least one thin-film transistor comprises a semiconductor layer on the substrate and a gate electrode on the semiconductor layer; and
the first wiring and the second wiring are on the same layer as the gate electrode.

14. The display device of claim 11, wherein a first cross-sectional area of the first wiring overlapping a first surface crossing the first wiring in the second direction is different from a second cross-sectional area of the first wiring overlapping a second surface that is parallel to the first surface and spaced apart from the first surface in the first direction.

15. The display device of claim 11, wherein a first thickness of the first wiring in a third direction that is perpendicular to the first direction and the second direction is different from a second thickness of the second wiring in the third direction.

16. The display device of claim 11, wherein:

the display area entirely surrounds the component area;

the component area includes a transmission area and a second non-display area between the transmission area and the display area; and the display element is in the display area.

17. The display device of claim 16, wherein:

the component area comprises a plurality of transmission areas;

the display element comprises a main display element and an auxiliary display element;

the main display element is in the display area; and the auxiliary display element is between the plurality of transmission areas that are adjacent to each other in the component area.

18. A display panel comprising:

a substrate including a component area, a display area at least partially surrounding the component area, and a first non-display area at least partially surrounding the display area;

a first wiring in the display area and extending in a first direction to face the component area;

a second wiring in the display area and extending in the first direction, the second wiring is spaced apart from the first wiring with the component area therebetween, wherein the first and second wirings are extended along a same imaginary straight line in the first direction;

a pixel circuit connected to one of the first wiring and the second wiring and comprising at least one thin-film transistor; and a display element connected to the pixel circuit, wherein at least one of:

the first wiring has a width in a second direction that is perpendicular to the first direction that is different from a width of the second wiring in the second direction; and a thickness of the first wiring in a third direction that is perpendicular to the first direction and the second direction is different from a thickness of the second wiring in the third direction.

* * * * *